US012649653B2

(12) United States Patent
Barsukou et al.

(10) Patent No.: US 12,649,653 B2
(45) Date of Patent: Jun. 9, 2026

(54) PIEZOELECTRIC MEMS DEVICE WITH THERMAL COMPENSATION FROM ONE OR MORE COMPENSATION LAYERS

(71) Applicant: Skyworks Global Pte. Ltd., Singapore (SG)

(72) Inventors: Siarhei Dmitrievich Barsukou, Takarazuka (JP); Myeong Gweon Gu, Seoul (KR); Hiroyuki Nakamura, Osaka-Fu (JP)

(73) Assignee: Skyworks Global Pte. Ltd., Singapore (SG)

( * ) Notice: Subject to any disclaimer, the term of this patent is extended or adjusted under 35 U.S.C. 154(b) by 552 days.

(21) Appl. No.: 17/936,348

(22) Filed: Sep. 28, 2022

(65) Prior Publication Data

US 2023/0094674 A1     Mar. 30, 2023

Related U.S. Application Data

(60) Provisional application No. 63/249,449, filed on Sep. 28, 2021.

(51) Int. Cl.
B81B 7/00 (2006.01)
B81B 3/00 (2006.01)
H04R 17/02 (2006.01)

(52) U.S. Cl.
CPC .......... B81B 7/0019 (2013.01); B81B 3/0021 (2013.01); B81B 3/0072 (2013.01);
(Continued)

(58) Field of Classification Search
CPC ... B81B 7/0019; B81B 3/0021; B81B 3/0072; B81B 2201/0257; B81B 2201/0264;
(Continued)

(56) References Cited

U.S. PATENT DOCUMENTS 3,979,565 A     9/1976   McShane
5,990,762 A     11/1999  Nakamura et al.
(Continued)

FOREIGN PATENT DOCUMENTS

DE         3309851        9/1984
JP       2009-260723      11/2009
(Continued)

OTHER PUBLICATIONS

Fang et al., "Determining mean and gradient residual stresses in thin films using micromachined cantilevers", J. Micromech. Microeng. vol. 6:301-309(1996).
(Continued)

*Primary Examiner* — Yasser A Abdelaziz
(74) *Attorney, Agent, or Firm* — Knobbe, Martens, Olson & Bear, LLP

(57)     ABSTRACT

A system for compensating for thermal stress in piezoelectric microelectromechanical systems devices can have a piezoelectric layer at least partially spanning a cavity such that it generates electrical signals when external forces cause the piezoelectric layer to vibrate with respect to the cavity. At least one electrode layer can include a conductive metal positioned adjacent the piezoelectric layer and configured as an electrode to accept the electrical signals. The piezoelectric layer and electrode layer can have an expected thermal stress tending to cause expected deflection even when external forces are not causing the piezoelectric layer to vibrate. A compensation layer can be positioned adjacent at least one of the piezoelectric layer and the at least one electrode layer and configured to counteract the expected deflection from the expected thermal stress.

11 Claims, 33 Drawing Sheets

(52) U.S. Cl.
CPC ...... *H04R 17/02* (2013.01); *B81B 2201/0257*
(2013.01); *B81B 2201/0264* (2013.01); *B81B*
*2201/032* (2013.01); *B81B 2203/0118*
(2013.01); *B81B 2203/0127* (2013.01); *B81B*
*2203/0307* (2013.01); *B81B 2203/0315*
(2013.01); *B81B 2203/0353* (2013.01); *B81B*
*2203/04* (2013.01); *B81B 2207/115* (2013.01);
*H04R 2201/003* (2013.01)

(58) Field of Classification Search
CPC ....... B81B 2201/032; B81B 2203/0118; B81B
2203/0127; B81B 2203/0307; B81B
2203/0315; B81B 2203/0353; B81B
2203/04; B81B 2207/115; H04R 17/02;
H04R 2201/003; H04R 2499/11; H04R
7/10
See application file for complete search history.

(56) References Cited

U.S. PATENT DOCUMENTS

| | | | |
|---|---|---|---|
| 6,347,862 B1* | 2/2002 | Kanno | B41J 2/1642 |
| | | | 347/68 |
| 6,348,845 B2 | 2/2002 | Nakamura et al. | |
| 6,351,196 B1 | 2/2002 | Nakamura et al. | |
| 6,624,550 B2 | 9/2003 | Biesenecker et al. | |
| 6,796,637 B2 | 9/2004 | Kitagawa et al. | |
| 6,801,100 B2 | 10/2004 | Nakamura et al. | |
| 6,882,250 B2 | 4/2005 | Uriu et al. | |
| 6,953,977 B2* | 10/2005 | MIcak | H10N 30/076 |
| | | | 257/421 |
| 7,104,134 B2 | 9/2006 | Amano et al. | |
| 7,446,629 B2 | 11/2008 | Nakamura et al. | |
| 7,652,412 B2* | 1/2010 | Nihei | B41J 2/1623 |
| | | | 310/346 |
| 7,701,311 B2 | 4/2010 | Nakamura et al. | |
| 8,253,513 B2 | 8/2012 | Zhang | |
| 8,369,555 B2 | 2/2013 | Fazzio et al. | |
| 8,427,259 B2 | 4/2013 | Fujiwara et al. | |
| 8,445,978 B2 | 5/2013 | Perruchot et al. | |
| 8,864,288 B2 | 10/2014 | Fujii et al. | |
| 8,994,251 B2 | 3/2015 | Kurachi et al. | |
| 9,070,864 B2 | 6/2015 | Hayashi et al. | |
| 9,099,634 B2 | 8/2015 | Inoue et al. | |
| 9,136,820 B2 | 9/2015 | Aida et al. | |
| 9,142,750 B2 | 9/2015 | Ohnishi et al. | |
| 9,203,378 B2 | 12/2015 | Fujiwara et al. | |
| 9,497,551 B2 | 11/2016 | Ruile et al. | |
| 9,608,192 B2 | 3/2017 | Zou et al. | |
| 9,621,126 B2 | 4/2017 | Burak et al. | |
| 9,722,576 B2 | 8/2017 | Fujiwara et al. | |
| 9,883,289 B2 | 1/2018 | Kushima et al. | |
| 9,967,676 B2 | 5/2018 | Matsuoka | |
| 10,020,443 B2 | 7/2018 | Naono et al. | |
| 10,135,422 B2 | 11/2018 | Goto et al. | |
| 10,476,482 B2 | 11/2019 | Niwa et al. | |
| 10,749,497 B2 | 8/2020 | Tang et al. | |
| 10,756,701 B2 | 8/2020 | Lee et al. | |
| 10,778,181 B2 | 9/2020 | Goto et al. | |
| 10,778,183 B2 | 9/2020 | Ando et al. | |
| 11,075,616 B2 | 7/2021 | Ando et al. | |
| 11,101,787 B2 | 8/2021 | Ando et al. | |
| 11,245,378 B2 | 2/2022 | Tang et al. | |
| 11,258,429 B2 | 2/2022 | Ando et al. | |
| 11,349,454 B2 | 5/2022 | Shin et al. | |
| 11,356,075 B2 | 6/2022 | Kadota et al. | |
| 11,387,808 B2 | 7/2022 | Shin et al. | |
| 11,424,732 B2 | 8/2022 | Shin et al. | |
| 11,616,487 B2 | 3/2023 | Nakamura et al. | |
| 11,616,491 B2 | 3/2023 | Tang et al. | |
| 11,689,178 B2 | 6/2023 | Nakamura et al. | |
| 11,750,174 B2 | 9/2023 | Ando et al. | |
| 11,818,540 B1 | 11/2023 | Qian et al. | |
| 11,824,515 B2 | 11/2023 | Tang et al. | |

| | | | |
|---|---|---|---|
| 11,881,837 B2 | 1/2024 | Caron et al. | |
| 11,894,828 B2 | 2/2024 | Nakamura et al. | |
| 11,909,377 B2 | 2/2024 | Caron et al. | |
| 11,909,378 B2 | 2/2024 | Caron et al. | |
| 11,916,533 B2 | 2/2024 | Kadota et al. | |
| 11,996,821 B2 | 5/2024 | Goto et al. | |
| 12,040,784 B2 | 7/2024 | Tang et al. | |
| 12,063,027 B2 | 8/2024 | Goto et al. | |
| 12,081,941 B2 | 9/2024 | Barsukou | |
| 12,404,167 B2 | 9/2025 | Barsukou | |
| 2005/0193822 A1 | 9/2005 | Amano et al. | |
| 2006/0232171 A1 | 10/2006 | Tietze | |
| 2009/0129611 A1 | 5/2009 | Leidl et al. | |
| 2010/0156554 A1 | 6/2010 | Nakamura et al. | |
| 2011/0233693 A1* | 9/2011 | Perruchot | H10N 30/2041 |
| | | | 257/417 |
| 2011/0318861 A1 | 12/2011 | Jahnes et al. | |
| 2013/0051586 A1 | 2/2013 | Stephanou et al. | |
| 2014/0035440 A1* | 2/2014 | Aida | G01C 19/5783 |
| | | | 310/365 |
| 2015/0350792 A1 | 12/2015 | Grosh et al. | |
| 2018/0152169 A1 | 5/2018 | Goto et al. | |
| 2018/0159494 A1 | 6/2018 | Goto et al. | |
| 2018/0312399 A1* | 11/2018 | Singh | B81C 1/00039 |
| 2019/0379347 A1 | 12/2019 | Goto et al. | |
| 2020/0408799 A1 | 12/2020 | Littrell | |
| 2021/0099152 A1 | 4/2021 | Goto et al. | |
| 2021/0111694 A1 | 4/2021 | Goto et al. | |
| 2021/0159883 A1 | 5/2021 | Kadota et al. | |
| 2022/0246824 A1 | 8/2022 | Barsukou et al. | |
| 2022/0255534 A1 | 8/2022 | Barsukou et al. | |
| 2022/0332568 A1 | 10/2022 | Barsukou et al. | |
| 2022/0368311 A1 | 11/2022 | Shin et al. | |
| 2022/0407496 A1 | 12/2022 | Hill et al. | |
| 2022/0408195 A1 | 12/2022 | Barsukou et al. | |
| 2023/0031568 A1 | 2/2023 | Tang et al. | |
| 2023/0039743 A1 | 2/2023 | Hui et al. | |
| 2023/0094674 A1 | 3/2023 | Barsukou et al. | |
| 2023/0098590 A1 | 3/2023 | Nakamura et al. | |
| 2023/0099440 A1 | 3/2023 | Barsukou et al. | |
| 2023/0104257 A1 | 4/2023 | Barsukou et al. | |
| 2023/0105726 A1 | 4/2023 | Tang et al. | |
| 2023/0105794 A1 | 4/2023 | Barsukou et al. | |
| 2023/0112443 A1 | 4/2023 | Barsukou et al. | |
| 2023/0112487 A1 | 4/2023 | Barsukou et al. | |
| 2023/0112677 A1 | 4/2023 | Tang et al. | |
| 2023/0124493 A1 | 4/2023 | Shin et al. | |
| 2023/0127983 A1 | 4/2023 | Chen et al. | |
| 2023/0179171 A1 | 6/2023 | Yasuda et al. | |
| 2023/0188896 A1 | 6/2023 | Barsukou et al. | |
| 2023/0216473 A1 | 7/2023 | Barsukou et al. | |
| 2023/0216482 A1 | 7/2023 | Yasuda et al. | |
| 2023/0216483 A1 | 7/2023 | Barsukou et al. | |
| 2023/0216484 A1 | 7/2023 | Barsukou et al. | |
| 2023/0234837 A1 | 7/2023 | Chen et al. | |
| 2023/0283255 A1 | 9/2023 | Nakamura et al. | |
| 2023/0303387 A1 | 9/2023 | Barsukou et al. | |
| 2023/0312334 A1 | 10/2023 | Barsukou et al. | |
| 2023/0319484 A1 | 10/2023 | Barsukou et al. | |
| 2023/0336159 A1 | 10/2023 | Hiramatsu et al. | |
| 2023/0343659 A1 | 10/2023 | Yasuda et al. | |
| 2023/0345182 A1 | 10/2023 | Yasuda et al. | |
| 2023/0345648 A1 | 10/2023 | Yasuda et al. | |
| 2023/0396233 A1 | 12/2023 | Nakamura et al. | |
| 2023/0396235 A1 | 12/2023 | Nakamura et al. | |
| 2024/0063775 A1 | 2/2024 | Ando et al. | |
| 2024/0098426 A1 | 3/2024 | Barsukou et al. | |

FOREIGN PATENT DOCUMENTS

| | | |
|---|---|---|
| WO | WO 2014/007015 | 1/2014 |
| WO | WO 2018/216632 | 11/2018 |

OTHER PUBLICATIONS

Greek et al., "Deflection of surface-micromachined devices due to internal, homogeneous or gradient stresses", Elsevier Science, Sensors and Actuators, vol. 78:1-7 (1999).

(56)        References Cited

OTHER PUBLICATIONS

Pobedinskas et al., "Thickness dependent residual stress in sputtered AlN thin films", Elsevier Science, Thin Solid Films, vol. 522:180-185 (2012).

Yamashita et al., "Diaphragm deflection control of piezoelectric ultrasonic microsensors for sensitivity improvement", Science Direct, Sensors and Actuators, vol. 139:118-123 (2007).

* cited by examiner

Key:

scandium doped aluminum nitride (Sc(0.2)AlN),
Ruthenium (Ru),
Molybdenum (Mo),
Aluminum (Al),
Silicon Dioxide (SiO2), Silicon (Si).

Young's modulus (Y),
Poisson's ratio (v),
thermal coefficient of expansion (a),
temperature change ($\Delta T$),
initial radius (R0),
radius change ($\Delta R$) after temperature increase of $\Delta T$,
stress ($\sigma$).

| STRESS AND THERMAL EXPANSION: 100°C | | | | | | | |
|---|---|---|---|---|---|---|---|
| MATERIAL | Y, Gpa | v | a, 10e-6[1/K] | $\Delta T$, K | R0, $\mu m$ | $\Delta R$, $\mu m$ | $\sigma$, Mpa |
| Sc(0.2)ALN | 390 | 0.29 | 4.9 | 100 | 400 | 0.196 | 123 |
| Ru | 447 | 0.25 | 9 | 100 | 400 | 0.36 | 251 |
| Mo | 312 | 0.31 | 4.8 | 100 | 400 | 0.192 | 98 |
| Al | 75 | 0.34 | 23.1 | 100 | 400 | 0.924 | 116 |
| SiO2 | 70 | 0.17 | 0.6 | 100 | 400 | 0.024 | 2 |
| Si | 130 | 0.28 | 3.57 | 100 | 400 | 0.1428 | 30 |

<u>FIG.3</u>

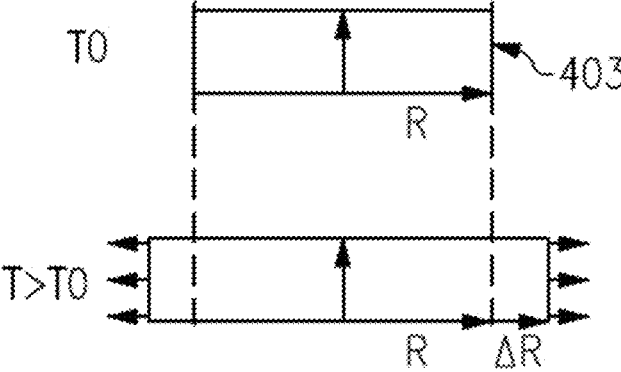
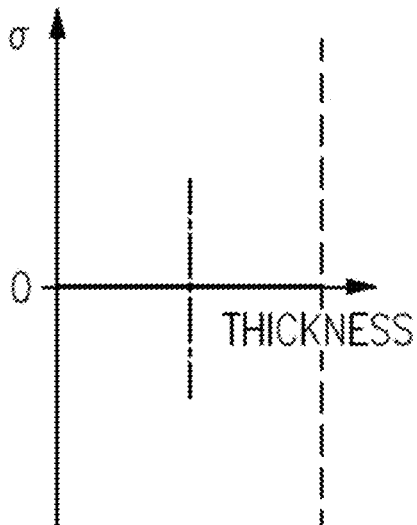
FIG.4A

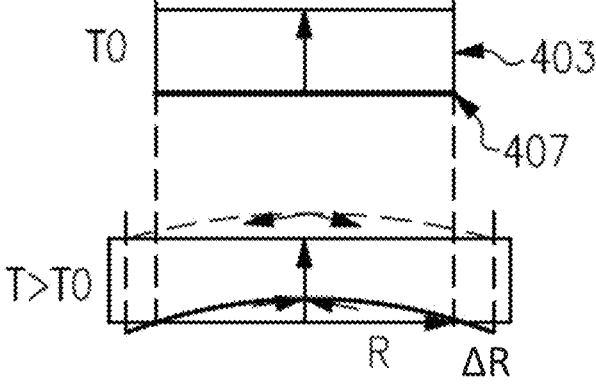
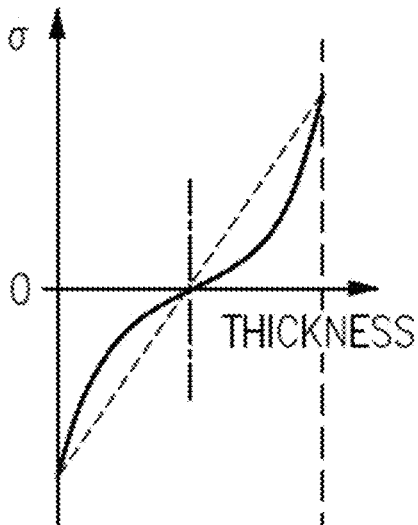
FIG.4B

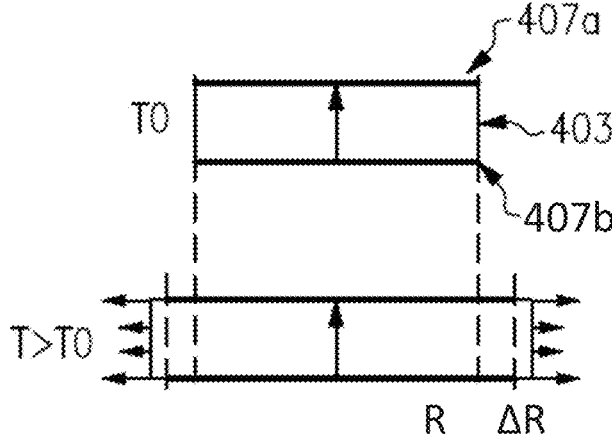
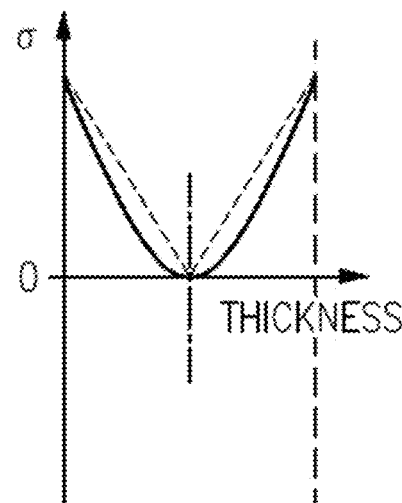
FIG.4C

Silicon Dioxide

| PROPERTY | VARIABLE | VALUE | UNIT |
|---|---|---|---|
| COEFFICIENT OF THERMAL EXPANSION | $\alpha$ | $0.6 \times 10^{-6}$ | 1/K |
| HEAT CAPACITY AT CONSTANT PRESSURE | Cp | 700 | $J/(kg \cdot K)$ |
| DENSITY | $\rho$ | 2200 | $kg/m^3$ |
| THERMAL CONDUCTIVITY | $k_{iso}$ | 1.4 | $W/(m \cdot K)$ |
| YOUNG'S MODULUS | E | $70 \times 10^9$ | Pa |
| POISSON'S RATIO | v | 0.17 | 1 |

FIG.6A

Stack:
Al
Sc(0.2)AlN
Al
Sc(0.2)AlN
Al

Stack:
Ru
Sc(0.2)AlN
Ru
Sc(0.2)AlN
Ru

Control (No Thermal Compensation)

Stack:
Mo
Sc(0.2)AlN
Mo
Sc(0.2)AlN
Mo nm
43
32
22
11
0
MAX:42
MIN:0

Stack:
Mo
Sc(0.2)AlN
Ru
Sc(0.2)AlN
Mo

Stack:
Ru
Sc(0.2)AlN
Mo
Sc(0.2)AlN
RU

Control (No Thermal Compensation)

Stack:
Mo
Sc(0.2)AlN
Mo
Sc(0.2)AlN
Mo

MAX:42
MIN:0

Stack:
Al
Sc(0.2)AlN
Ru
Sc(0.2)AlN
Al

Stack:
Ru
Sc(0.2)AlN
Mo
Sc(0.2)AlN
Mo
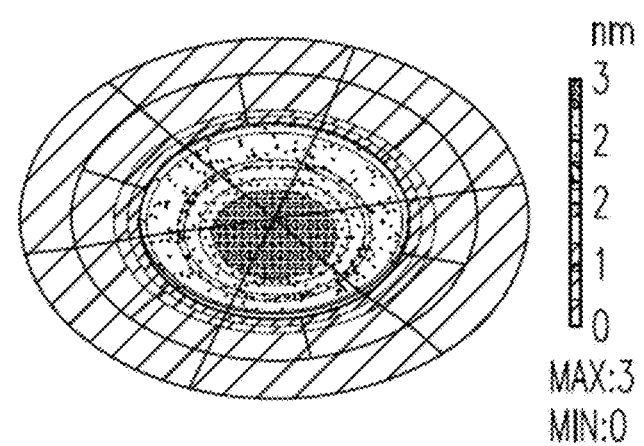
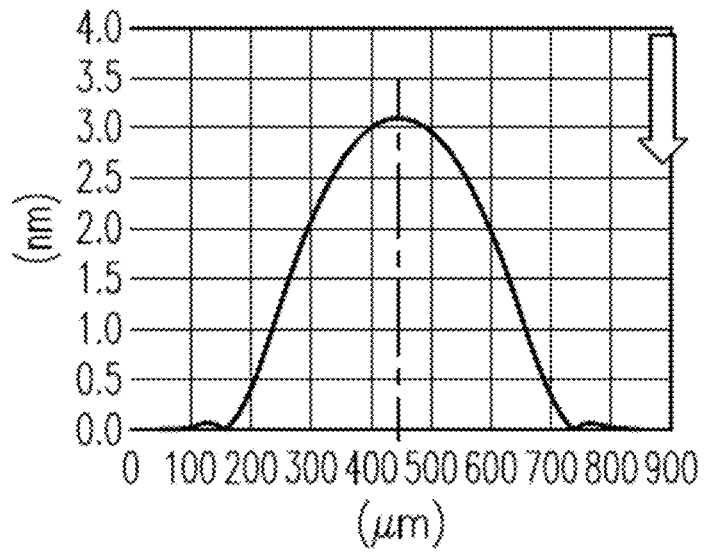
FIG.10B

Symmetrical
bimorph, same
thicknesses

Asymmetrical
bimorph, same
metal thicknesses

Asymmetrical
bimorph, different
metal thicknesses

Asymmetrical bimorph,
different metal and
piezoelectric thicknesses

PIEZOELECTRIC MEMS DEVICE WITH THERMAL COMPENSATION FROM ONE OR MORE COMPENSATION LAYERS

INCORPORATION BY REFERENCE TO ANY PRIORITY APPLICATIONS

This application is based upon and claims the benefit of priority from U.S. Provisional Patent Application No. 63/249,449 filed on Sep. 28, 2021. Any and all applications for which a foreign or domestic priority claim is identified in the Application Data Sheet as filed with the present application are hereby incorporated by reference under 37 CFR 1.57. The entire contents of each of the above-listed items is hereby incorporated into this document by reference and made a part of this specification for all purposes, for all that each contains.

BACKGROUND

Field

Embodiments of the invention relate to a piezoelectric micromechanical systems (MEMS) device.

Description of the Related Technology

A MEMS microphone is a type of micro-machined electromechanical device used to convert sound pressure (e.g., voice sound) to an electrical signal (e.g., voltage). MEMS microphones are useful for mobile devices, headsets, smart speakers and other voice-interface devices or systems, for example. Conventional capacitive MEMS microphones suffer from high power consumption (e.g., large bias voltage) and reliability, for example when used in a harsh environment (e.g., when exposed to dust and/or water).

Piezoelectric MEMS microphones can be used to address the deficiencies of capacitive MEMS microphones. Piezoelectric MEMS microphones offer a constant listening capability while consuming almost no power (e.g., no bias voltage is needed), are robust and immune to water and dust contamination.

Piezoelectric MEMS microphones work on the principle of the piezoelectric effect, converting acoustic signals to electric signals when sound waves vibrate the piezoelectric sensor. The sound waves bend the piezoelectric film layers of a cantilevered beam or membrane, causing stress and strain, resulting in charges being generated in the piezoelectric film layers. The charges are converted to voltage as an output signal, by the placement of one or more electrodes on the piezoelectric film layers. Performance of such microphones therefore depends on the membrane or cantilever's ability to respond to acoustic waves. The present disclosure describes how to achieve improved sensitivity of such microphones, for example.

SUMMARY

According to an embodiment there is provided a piezoelectric microelectromechanical systems device, comprising a first piezoelectric layer, a first metal layer adjacent the first piezoelectric layer and comprising a first metal, a second metal layer comprising a second metal, the first and second metals having different properties to compensate for deflection due to thermal stress of any or all of the piezoelectric layer, the first metal layer, and second metal layer and a substrate including at least one wall defining a cavity and the at least one wall supporting the layers.

In some examples the device comprises a third metal layer.

In some examples the first, second and third metal layers are upper, lower and middle layers respectively.

In some examples two of the first, second and third metal layers comprise different thicknesses from each other.

In some examples the third metal layer is composed of a different metal from the first metal layer and the second metal layer.

In some examples the third metal is composed of the same metal of the first metal layer and/or second metal layer.

In some examples the device comprises a second piezoelectric layer adjacent the first or second metal layer and the third metal layer is adjacent the second piezoelectric layer.

In some examples the first and second piezoelectric layers have different thicknesses from each other.

In some examples the piezoelectric layer and first and second metal layers are alternated.

In some examples the first piezoelectric layer, second piezoelectric layer, first metal layer, second metal layer and third metal layer are alternated.

In some examples, the layers are arranged in a stack that alternates between metal and piezoelectric material.

In some examples the piezoelectric and metal layers form a membrane that spans the cavity.

In some examples the piezoelectric and metal layers form a cantilever that extends across at least a portion of the cavity.

In some examples the second metal layer is composed of a metal with a higher Young's modulus than the first metal layer, and the second metal layer is an upper metal layer, and the first metal layer is a lower metal layer.

In some examples the second metal layer is composed of a metal with a higher Young's modulus than the first metal layer, and the second metal layer is an upper metal layer, and the first metal layer is a lower metal layer.

In some examples the first and second metal layers are composed of Molybdenum, and the third metal layer is composed of Ruthenium.

In some examples the Ruthenium metal layer is an upper metal layer.

In some examples the first and second metal layers comprise an upper and lower metal layer respectively, and the third metal layer is deposited on the upper metal layer. Optionally the metal layer deposited on the upper metal layer is composed from a different material than the upper and lower metal layers. Optionally the third metal layer is composed from the same material as the first and/or second metal layers.

In some examples the piezoelectric layer is 300 nanometers thick.

In some examples the first and second metal layers are each 30 nanometers thick.

In some examples the first, second and third metal layers are each 30 nanometers thick.

In some examples the radius of the membrane may be 400 micrometers.

In some examples the device is a microphone.

In some examples the device is a pressure sensor.

According to some embodiments, a method of manufacturing a piezoelectric microelectromechanical systems device comprises providing a substrate, depositing a first metal layer comprising a first metal, a first piezoelectric layer and a second metal layer on the substrate, the second metal layer comprising a second metal, the first and second metals having different properties to compensate deflection due to thermal stress of any or all of the piezoelectric layer, the first metal layer, and second metal layer, and defining a cavity having at least one cavity wall.

According to some embodiments, a wireless mobile device comprises one or more antennas, a front end system that communicates with the one or more antennas, and one or more piezoelectric microelectromechanical systems microphones, each microphone including a first piezoelectric layer, a first metal layer comprising a first metal, a second metal layer comprising a second metal, the first and second metals having different properties to compensate deflection due to thermal stress of any or all of the piezoelectric layer, the first metal layer, and second metal layer, and a substrate including at least one wall defining a cavity and the at least one wall supporting the layers.

Additional Embodiments

In some examples, there is disclosed a system for compensating for thermal stress in piezoelectric microelectromechanical systems devices at least partially spanning a cavity. The system can include at least one piezoelectric layer at least partially spanning a cavity such that it generates electrical signals when external forces cause the piezoelectric layer to vibrate with respect to the cavity. The system can further have at least one electrode layer including a conductive metal positioned adjacent the piezoelectric layer and configured as an electrode to accept the electrical signals. The piezoelectric layer and electrode layer can have an expected thermal stress tending to cause expected deflection even when external forces are not causing the piezoelectric layer to vibrate. The system can further include a compensation layer positioned adjacent at least one of the piezoelectric layer and the at least one electrode layer and configured to counteract the expected deflection from the expected thermal stress.

In some examples, the compensation layer has a selected thickness configured to resist pre-excitation bowing of the piezoelectric layer and the at least one electrode layer.

In some examples, the compensation layer has a selected material property configured to resist pre-excitation bowing of the piezoelectric layer and the at least one electrode layer.

In some examples, the selected material property includes a property related to stiffness or resiliency.

In some examples, the property related to stiffness or resiliency includes a Young's modulus of the compensation layer.

In some examples, the compensation layer is deposited directly on the electrode layer.

In some examples, the compensation layer is deposited on the piezoelectric layer.

In some examples, the system further includes a second piezoelectric layer and a second electrode layer forming a stack with the at least one piezoelectric layer and the at least one electrode layer such that electrode and piezoelectric layers alternate.

In some examples, the second electrode layer is configured to act as the compensation layer.

In some examples, the compensation layer has a thickness and stiffness that collectively compensate for the expected deflection.

A piezoelectric microelectromechanical systems device can include: a layer set sensitive to acoustic vibration, the layers including at least one piezoelectric layer and a two metal electrode layers, the layer set having an expected thermal stress deflection corresponding to a first thermal condition; a cavity having side walls supporting the layer set and providing space for acoustic vibration of the layer set into the cavity; and a compensation layer deposited directly onto one of the two metal electrode layers, the compensation layer having a compensation characteristic configured to compensate for the expected thermal stress deformation, such that the combined layer set and compensation layer do not have the stress deflection under the first thermal condition.

In some examples, the layer set forms an acoustic membrane spanning the cavity, and between the cavity walls and the membrane is located a silicon dioxide layer.

In some examples, the two metal electrode layers include a layer of Molybdenum and the compensation layer includes Ruthenium deposited on the layer of Molybdenum.

In some examples, the compensation layer is selected to additionally compensate for thermal stress by conducting thermal energy from at least one of the two metal electrode layers, thereby raising the net melting point.

In some examples, at least one electrode layer includes ruthenium and the piezoelectric layer is formed thereon from aluminum nitride.

In some examples the compensation layer is composed of the same metal as one or more of the two metal electrode layers.

In some examples the layer set includes two piezoelectric layers and three metal electrode layers arranged in a stack that alternates between metal and piezoelectric material, and the layer set forms a membrane that spans the cavity.

In some examples the two piezoelectric layers have different thicknesses from each other.

In some examples at least one of the three metal electrode layers has a different thickness than at least one of the other two metal electrode layers.

In some examples the piezoelectric layer is more than 250 nanometers thick, at least one of the metal electrode layers is less than 50 nanometers thick, and the width of the cavity is more than 400 micrometers.

In some examples the piezoelectric microelectromechanical systems device is a microphone configured for use in a wireless mobile device. The wireless mobile device can include one or more antennas and a front end system that communicates with the one or more antennas. It can also include one or more piezoelectric microelectromechanical systems devices, each device including layers having properties configured to compensate for deflection due to thermal stress of other layers spanning a cavity.

Further Embodiments

In some embodiments, a piezoelectric microelectromechanical systems device comprises a cavity bounded by walls, and an asymmetrical bimorph structure at least partially spanning the cavity and including at least a piezoelectric layer and two electrode layers. The electrode layers can have relative thicknesses configured to compensate for expected temperature stress in the bimorph structure.

In some examples, the bimorph structure includes two piezoelectric layers in a stack with three intervening electrode layers formed from metal.

In some examples, the bimorph structure includes a top metal layer, an upper piezoelectric layer, a middle metal layer, a lower piezoelectric layer, and a bottom metal layer, the metal layers including electrode layers.

In some examples, the lower piezoelectric layer is thicker than the upper piezoelectric layer by an amount configured to offset thermal stress affects that would exist if the two piezoelectric layers had the same thickness.

In some examples, the top metal layer is thicker than the middle and bottom metal layers by an amount configured to offset thermal stress affects that would exist if the two piezoelectric layers had the same thicknesses and the metal layers had the same thicknesses.

In some examples, the bottom metal layer is thicker than the middle and top metal layers, and the lower piezoelectric layer is thicker than the upper piezoelectric layer, each by amounts collectively configured to offset thermal stress affects that would exist if the two piezoelectric layers had the same thicknesses and the three metal layers had the same thicknesses.

In some examples, the piezoelectric microelectromechanical systems device can further include a compensation layer deposited directly on one of the electrode layers and having a thickness configured to further compensate for the expected temperature stress in the bimorph structure.

In some examples, the cavity forms a resonant cavity for an acoustic sensor, the asymmetrical bimorph structure forms a resonator, and the relative thicknesses compensate for expected temperature stress, thereby causing the resonator to respond under expected temperature conditions the same way they are designed to respond without the temperature conditions.

In some examples, the expected temperature stress would cause bowing in one direction and the relative thicknesses cause bowing in an opposite direction, thereby compensating before the temperature stress occurs.

In some embodiments, a piezoelectric microelectromechanical systems device can comprise a layer set sensitive to acoustic vibration, the layers including at least one piezoelectric layer and a two metal electrode layers having the same thickness, the layer set having an expected thermal stress deflection corresponding to a first thermal condition; a cavity having side walls supporting the layer set and providing space for acoustic vibration of the layer set into the cavity; and a compensation layer deposited directly onto one of the two metal electrode layers, the compensation layer having a compensation thicknesses configured to compensate for the expected thermal stress deformation, such that the combined layer set and compensation layer do not have the stress deflection under the first thermal condition.

In some examples, the layer set forms an acoustic membrane spanning the cavity, and between the cavity walls and the membrane is located a silicon dioxide layer.

In some examples, there is disclosed a system for compensating for thermal stress in piezoelectric microelectromechanical systems devices at least partially spanning a cavity. The system can comprise at least one piezoelectric layer at least partially spanning a cavity such that it generates electrical signals when external forces cause the piezoelectric layer to vibrate with respect to the cavity. The system can further comprise at least one electrode layer including a conductive metal positioned adjacent the piezoelectric layer and configured as an electrode to accept the electrical signals. The piezoelectric layer and electrode layer can have an expected thermal stress tending to cause expected deflection even when external forces are not causing the piezoelectric layer to vibrate. The system can further comprise a compensation layer positioned adjacent at least one of the piezoelectric layer and the at least one electrode layer and configured to counteract the expected deflection from the expected thermal stress.

In some examples, the compensation layer has a selected thickness configured to resist pre-excitation bowing of the piezoelectric layer and the at least one electrode layer.

In some examples, the compensation layer has a selected material property configured to resist pre-excitation bowing of the piezoelectric layer and the at least one electrode layer.

In some examples, the selected material property comprises a property related to stiffness or resiliency.

In some examples, the property related to stiffness or resiliency comprises a Young's modulus of the compensation layer.

In some examples, the compensation layer is deposited directly on the electrode layer.

In some examples, the compensation layer is deposited on the piezoelectric layer.

In some examples, the system further comprises a second piezoelectric layer and a second electrode layer forming a stack with the at least one piezoelectric layer and the at least one electrode layer such that electrode and piezoelectric layers alternate.

In some examples, the second electrode layer is configured to act as the compensation layer.

In some examples, the compensation layer has a thickness and stiffness that collectively compensate for the expected deflection.

According to an embodiment there is provided a piezoelectric microelectromechanical systems device, including a first piezoelectric layer, a first metal layer adjacent the first piezoelectric layer and comprising a first metal, a second metal layer comprising a second metal, the first and second metals having different properties to compensate for deflection due to thermal stress of any or all of the piezoelectric layer, the first metal layer, and second metal layer and a substrate including at least one wall defining a cavity and the at least one wall supporting the layers.

In some examples the device includes a third metal layer.

In some examples the first, second and third metal layers are upper, lower and middle layers respectively.

In some examples two of the first, second and third metal layers comprise different thicknesses from each other.

More Embodiments

In some examples the third metal layer is composed of a different metal from the first metal layer and the second metal layer.

In some examples the third metal is composed of the same metal of the first metal layer and/or second metal layer.

In some examples the device comprises a second piezoelectric layer adjacent the first or second metal layer and the third metal layer is adjacent the second piezoelectric layer.

In some examples the first and second piezoelectric layers have different thicknesses from each other.

In some examples the piezoelectric layer and first and second metal layers are alternated.

In some examples the first piezoelectric layer, second piezoelectric layer, first metal layer, second metal layer and third metal layer are alternated.

In some examples, the layers are arranged in a stack that alternates between metal and piezoelectric material.

In some examples the piezoelectric and metal layers form a membrane that spans the cavity.

In some examples the piezoelectric and metal layers form a cantilever that extends across at least a portion of the cavity.

In some examples the second metal layer is composed of a metal with a higher Young's modulus than the first metal layer, and the second metal layer is an upper metal layer, and the first metal layer is a lower metal layer.

In some examples the second metal layer is composed of a metal with a higher Young's modulus than the first metal layer, and the second metal layer is an upper metal layer, and the first metal layer is a lower metal layer.

In some examples the first and second metal layers are composed of Molybdenum, and the third metal layer is composed of Ruthenium.

In some examples the Ruthenium metal layer is an upper metal layer.

In some examples the first and second metal layers comprise an upper and lower metal layer respectively, and the third metal layer is deposited on the upper metal layer. Optionally the metal layer deposited on the upper metal layer is composed from a different material than the upper and lower metal layers. Optionally the third metal layer is composed from the same material as the first and/or second metal layers.

In some examples the piezoelectric layer is 300 nanometers thick.

In some examples the first and second metal layers are each 30 nanometers thick.

In some examples the first, second and third metal layers are each 30 nanometers thick.

In some examples the radius of the membrane may be 400 micrometers.

In some examples the device is a microphone.

In some examples the device is a pressure sensor.

According to some embodiments, a method of manufacturing a piezoelectric microelectromechanical systems device comprises providing a substrate, depositing a first metal layer comprising a first metal, a first piezoelectric layer and a second metal layer on the substrate, the second metal layer comprising a second metal, the first and second metals having different properties to compensate deflection due to thermal stress of any or all of the piezoelectric layer, the first metal layer, and second metal layer, and defining a cavity having at least one cavity wall.

According to some embodiments, a wireless mobile device comprises one or more antennas, a front end system that communicates with the one or more antennas, and one or more piezoelectric microelectromechanical systems microphones, each microphone including a first piezoelectric layer, a first metal layer comprising a first metal, a second metal layer comprising a second metal, the first and second metals having different properties to compensate deflection due to thermal stress of any or all of the piezoelectric layer, the first metal layer, and second metal layer, and a substrate including at least one wall defining a cavity and the at least one wall supporting the layers.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 3 is a table of properties of metals according to aspects of the present disclosure;

FIG. 4A-4C are cross sectional views of devices, and a graph, showing stress;

FIG. 6A is a table of properties of silicon dioxide according to aspects of the present disclosure;

FIG. 10A-10B are perspective views and graphs of stress in devices according to aspects of the present disclosure;

DETAILED DESCRIPTION

Aspects and embodiments described herein are directed to a piezoelectric micromechanical systems (MEMS) device for thermal compensation. Temperature can affect a piezoelectric MEMS device, causing the piezoelectric layers and the metal layers to expand or contract and cause unwanted deflection and residual stress in the membrane or cantilever, reducing the performance of the device. Embodiments described herein are directed at solving this problem.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all the described terms.

The embodiments described herein are directed to a piezoelectric MEMS device comprising a membrane. However, the techniques described herein may be applied to a cantilever sensor in a device. The device described herein may be a microphone or a pressure sensor, or any other piezoelectric MEMS device. As an example, embodiments described herein are directed to microphones, however it will be appreciated that the techniques and methods described herein are applicable for other devices.

Figure 1A:
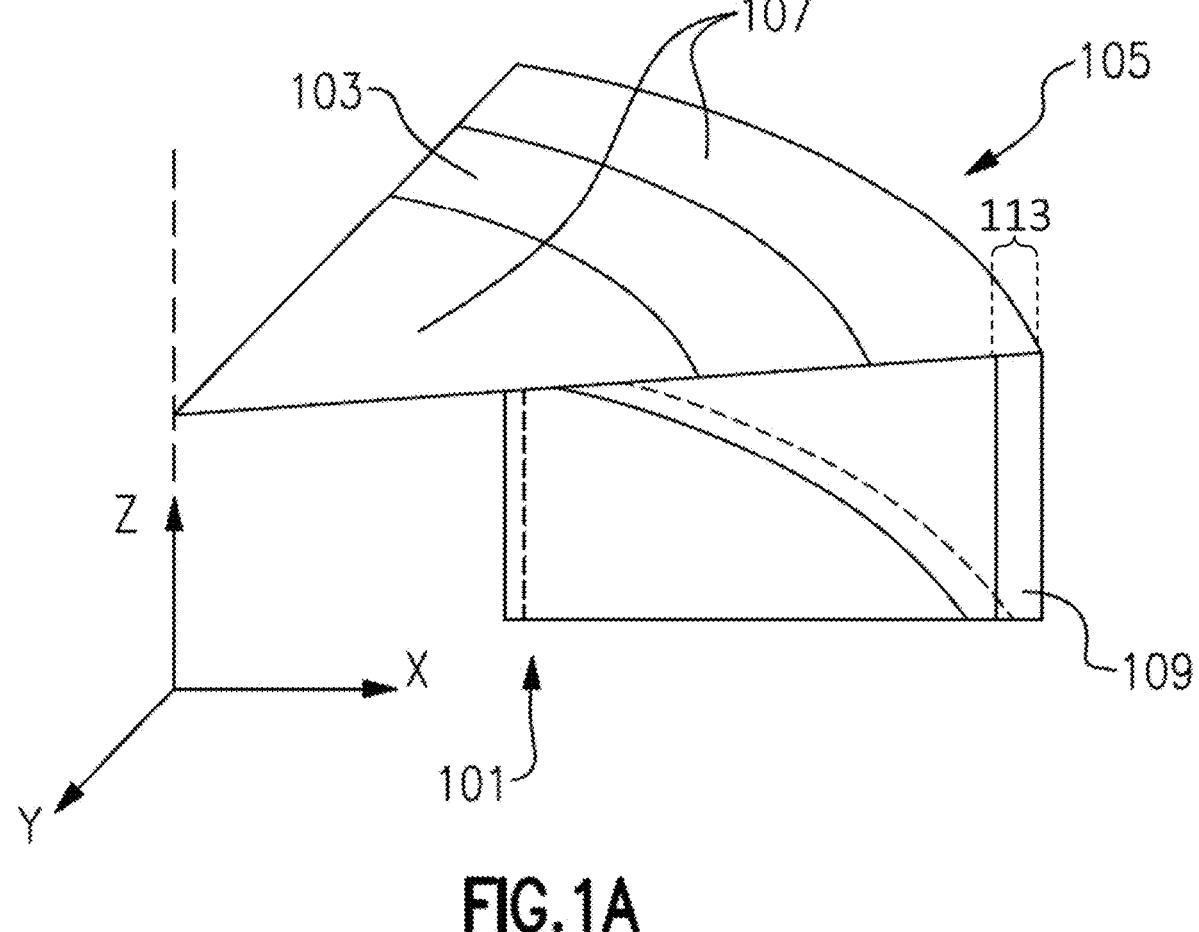
FIG. 1A is a perspective view of a device according to aspects of the present disclosure.

FIG. 1A shows a perspective view of a section of a piezoelectric microelectromechanical systems (MEMS) microphone (hereinafter the "microphone") according to embodiments described herein, comprising a membrane 105 extending across a cavity 101. Only a portion of the device is shown in FIG. 1A, but the device extends 360 degrees around the center of the membrane shown. In this embodiment the membrane is circular, and the cavity 101 is circular. However, the membrane may be any suitable shape, such as a polygon or a rectangular shape, and the cavity may be any suitable shape, such that the cavity and membrane may be the same shape. The membrane is supported around its perimeter by cavity walls 109. The area at which the membrane is supported by the cavity walls, i.e., where the piezoelectric layer overlaps the cavity walls, is called the anchor region 113. The membrane is therefore free to vibrate in the z direction, i.e. into and out of the cavity. The cavity walls can be formed from a substrate, such as silicon, or silicon with a layer of silicon dioxide located on top, such that the silicon dioxide layer is located between the membrane and cavity walls. The cavity 101 and the cavity walls 109 on which the perimeter of the membrane 105 is supported at the anchor region 113 may be circular. The membrane comprises at least one piezoelectric layer 103. The piezoelectric layer 103 may be any suitable piezoelectric material, such as Scandium doped Aluminum Nitride (ScAlN) or Aluminum Nitride (AlN).

FIG. 1A shows two portions of a metal layer 107 from a top view. However, the membrane can comprise at least two metal layers 107a and 107b. As shown in the cross sectional view of FIG. 1B, three metal layers are possible, (107a is above, 107b is below, with a third layer, 107c, in between). The metal layers form electrodes, such that "metal layer" and "electrode" may be used interchangeably throughout this disclosure, and the metal layers may be composed of any suitable conductive material. For example the metal may be molybdenum, or ruthenium. A first metal layer 107a is located on top of the first piezoelectric layer, and a second metal layer 107b is located on the underside of the first piezoelectric layer, such that together the piezoelectric layer and metal layers form an alternating stack, where the piezoelectric layer is sandwiched between metal layers. Either of the metal layers may be the first or second metal layer. In some embodiments there may be a second piezoelectric layer, and a third metal layer (e.g., 107c), such that there is a third metal layer located in the middle of the two piezoelectric layers (107a and 107b). As described, the membrane can comprise at least one piezoelectric layer and at least two metal layers, where each respective metal layer may be comprised of a different metal having different respective properties to compensate for deflection of the piezoelectric and metal layers, as will be described herein. For example, the first and second metal layer layers may comprise different metals having different properties, and the third metal layer may comprise a metal that is different from either or both of the first and second metal layers. Or, the third metal layer may comprise the same metal as one or both of the first or second metal layers. There may be an inner and an outer electrode for each metal layer, such that the inner and outer electrode may be in same plane where the plane is perpendicular to the z axis. This is the configuration shown in FIGS. 1A and 1B. The outer electrode is located at the perimeter of the membrane, and the inner electrode is located at the center of the membrane, such that there is an area in between the inner edge of the outer electrode, and the outer edge of the inner electrode where the piezoelectric layer 103 is exposed. The membrane moves in response to an acoustic signal that exerts positive or negative pressure in the z direction, for example. The at least one piezoelectric layer experiences stress and strain due to bending from this pressure, and due to the piezoelectric effect, charges are created which are collected by the electrode, formed from the metal layer, on either side of the piezoelectric layer. One electrode is negative, one is positive and one is the ground electrode.

Figure 1B:
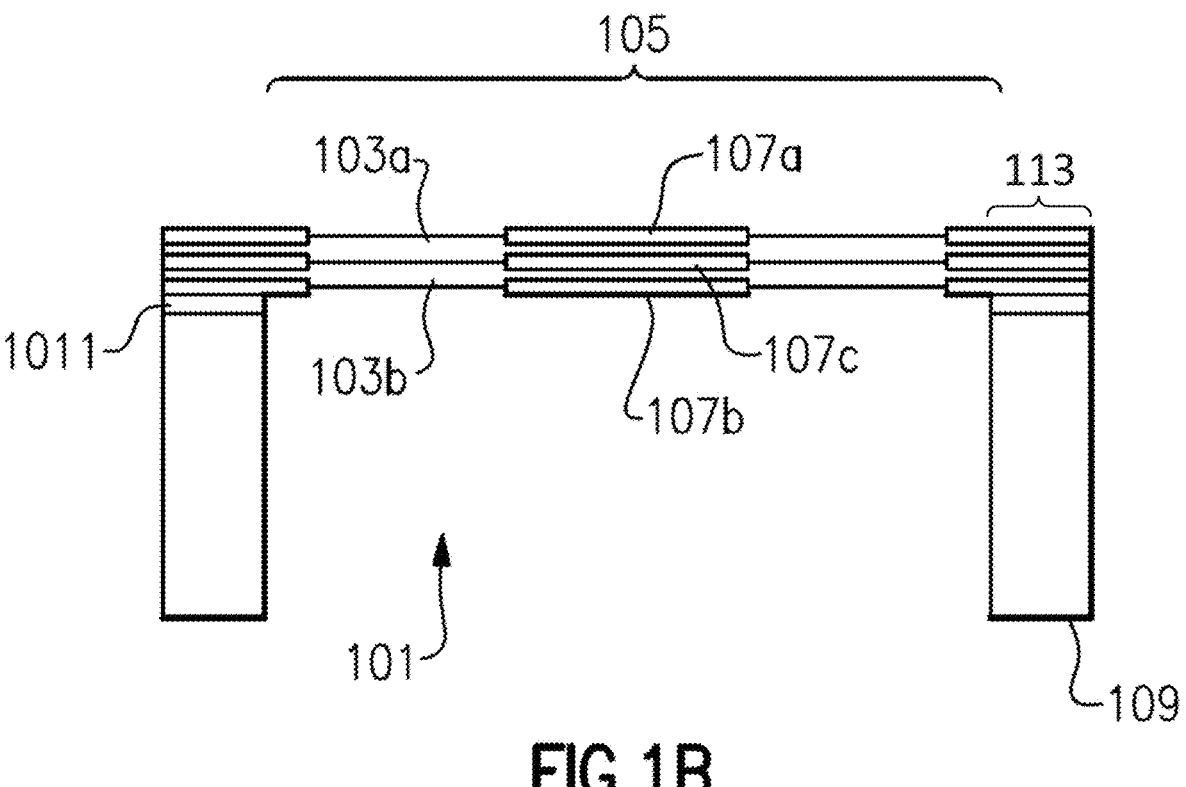
FIG. 1B is a cross sectional view of a device according to aspects of the present disclosure.

FIG. 1B shows a cross sectional view of the piezoelectric MEMS microphone of the embodiment of FIG. 1A. As described in relation to FIG. 1A, the microphone may comprise two metal layers and one piezoelectric layer. However, in the embodiment of FIG. 1B the membrane comprises two piezoelectric layers 103a, and 103b, and three metal layers. There is an upper metal layer 107a, a lower metal layer 107b and a middle metal layer 107c. When described herein, "upper metal layer" means a metal layer (e.g., 107a) deposited on the front side of the stack, i.e. the side opposite the cavity, and "lower metal layer" means a metal layer (e.g., 107b) deposited on the underside of the stack, i.e. on the cavity side of the stack. The same language is used for the piezoelectric layers. As shown in FIG. 1B, the metal layers and piezoelectric layers are alternating, such that the lower piezoelectric layer 103b is located between the lower 107b and middle 107c metal layers, and the upper piezoelectric layer 103a is located between the upper 107a and middle 107c metal layers. The relative thickness of the metal layers and piezoelectric layers as shown in FIG. 1B are not to scale. Each layer of metal may have an inner and outer electrode, as described in relation to FIG. 1A (where inner is closer to the center of radius for the illustrated circular configuration and outer is farther from the center of radius). The microphone may also comprise only one electrode at each of the three layers. For example, the upper electrode may cover the entire area of the membrane, such that there is no exposed piezoelectric layer away from the anchor region 113. In a three dimensional device, the embodiment of FIGS. 1A and 1B have circular electrodes, such that the outer electrodes form a ring around the perimeter of the membrane, and the inner electrode is a circle at the center of the membrane. As shown, the membrane is supported by the cavity walls 109. The membrane 105 shown in FIGS. 1A and 1B is a membrane in which there is no residual stress, (the membrane has no deflection when resting), and therefore the z-displacement amplitude of the perimeter of the membrane is the same as the center of the membrane, i.e. the membrane is flat. Although not shown, the membrane may comprise a hole extending through all of the layers, such that air can pass into and out of the cavity, from one side of the membrane to the other.

This can be useful to avoid unwanted pressure build-up inside the cavity that may cause a membrane to bulge outward.

In an embodiment comprising a cantilever, there may also be at least one piezoelectric layer, and at least two metal layers arranged with generally the same shape around the piezoelectric layer to collectively form one or more cantilevered beams. A cantilever embodiment can be similar to the illustrated portion shown in FIG. 1A, for example, if it does not continue to form a circular shape. The cantilevered beams may be any suitable shape, such as rectangular or triangular. The one or more cantilevered beams can be supported by the cavity walls at a fixed end (e.g., the outer end at the anchor region 113 of FIG. 1A), and can be free to move at a free end (e.g., the inner tip of FIG. 1A).

In the described embodiments, the piezoelectric layers may be 300 nanometers thick, the metal layers, i.e. electrodes, may be 30 nanometers thick, the silicon dioxide may be 3 micrometers thick in the radial direction, and the radius of the membrane may be 400 micrometers. The membrane is supported by the cavity walls, wherein the cavity walls are composed of a silicon dioxide layer 1011 located on top of silicon. Thus there may be an overlap between the silicon dioxide and membrane (e.g., at the anchor region 113) of around 2 to 3 micrometers.

Figure 2:
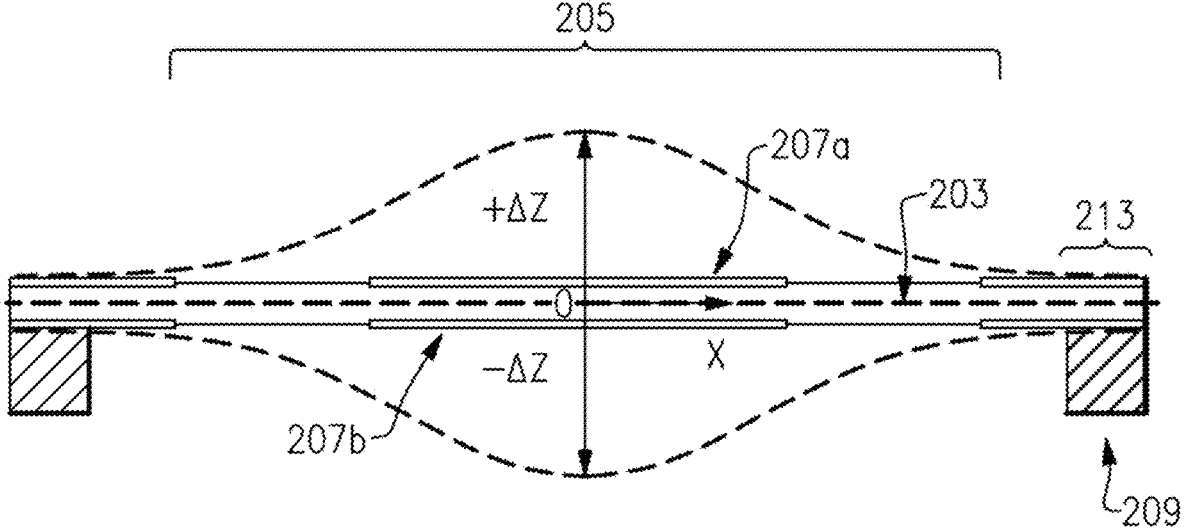
FIG. 2 is a cross sectional view of a known device.

FIG. 2 shows a cross sectional view of an arrangement of a microphone, wherein the membrane 205 is supported from underneath by cavity walls 209, and in which there is residual stress within the membrane. In this arrangement, the microphone comprises two metal layers 207a and 207b, and one piezoelectric layer 203. As shown, the residual stress can result in deflection of the membrane into or out of the cavity, i.e. ±ΔZ, as shown by the dashed line. As shown, the deflecting membrane may from the shape of a bell curve, such that the deflecting membrane achieves a maximum displacement (peak or trough) at the center of the membrane, and decreases to have much less displacement near the anchor region 213, where the membrane is supported by and held to the cavity walls 209. The stress causing this displacement may arise due to thermal expansion, arising in manufacture or in use of the device. The stress due to thermal expansion may lead to a decrease in performance of the device, especially biaxial thermal stress. The performance of a microphone may be decreased due to deflection in the membrane, affecting its ability to deflect when acoustic signals are received. The deflection in a membrane also decreases the linearity (close correspondence of microphone signal to incoming sound) of the microphone because the membrane's deflection is not just due to acoustic waves. Deflection can thus decrease the microphone's ability to measure sound. A microphone comprising a cantilever will experience a similar stress and deflection due to temperature, and therefore, the techniques described herein may also be used to compensate the stress and deflection in a cantilevered beam. Nevertheless, biaxial stress can be less of a problem in cantilevered devices.

FIG. 3 is a table of properties (e.g., relating to stress and thermal expansion) of different materials at 100 degrees Celsius. The table lists for each material: Young's modulus (Y), Poisson's ratio (v), thermal coefficient of expansion (a), temperature change (ΔT) between initial temperature and 100 degrees Celsius, initial radius (R0), radius change (ΔR) after temperature increase of ΔT, stress (σ). These properties are listed for the materials: scandium doped aluminum nitride (Sc(0.2)AlN), Ruthenium (Ru), Molybdenum (Mo), Aluminum (Al), Silicon Dioxide (SiO2), Silicon (Si). The properties listed are for free materials, that is, materials not in a stack, and will be used herein when describing the properties of materials used in combination in stacks.

FIGS. 4A-4C illustrate the stress within a piezoelectric and metal layered stack, and the variation in this stress with thickness of the stack. The cross sectional view of the stack at temperature T0 is shown in the top of each of the FIGS. 4A-4C, the cross sectional view of the stack with thermal stress, at a temperature T>T0, is shown in the middle each of the FIGS. 4A-4C, and the graph showing the stress (σ) versus thickness is shown on the bottom of each of the FIGS. 4A-4C.

FIG. 4A illustrates an arrangement in which the stack comprises at one piezoelectric layer 403. In this arrangement there is no metal layer. The at least one piezoelectric layer may be composed of aluminum nitride, or scandium doped aluminum nitride. The piezoelectric layer has a radius of R. As shown in the middle portion of FIG. 4A, when experiencing a new temperature T, the piezoelectric layer experiences radial expansion due to an increase in temperature, ΔT, where ΔT=T−T0. The expansion increases the radius of the layer by ΔR. The expansion arises from biaxial homogenous stress, as shown by the arrows pointing outward from the piezoelectric layer. As shown in the bottom portion of FIG. 4A, there is no stress gradient (that is, it does not experience sheer stresses from different layers attempting to expand differently) as the stack is composed of the same material throughout, and therefore the entire stack has the same thermal coefficient of expansion (TCE).

FIG. 4B illustrates an arrangement in which the stack comprises at least one piezoelectric layer 403, with one metal layer 407 located on the underside of the piezoelectric layer. In this arrangement, the piezoelectric layer may be composed of aluminum nitride or scandium doped aluminum nitride. This illustration shows a metal layer 407 that is substantially thinner than the piezoelectric layer 403. As shown, temperature T0 is chosen such that there is no stress or bending in the stack at this temperature. The piezoelectric and metal layers have a radius of R at temperature T0. As shown in the middle portion of FIG. 4B, at a temperature, T, wherein T is greater than T0, there is a biaxial homogeneous stress in the piezoelectric layer 403, and the metal layer, expanding the layers by a radius ΔR. As shown in the middle portion of FIG. 4B, there may also be bending in of the stack, arising due to a difference in the thermal coefficients of expansion (TCE) and Young's modulus between metal layer and the piezoelectric layer. The bending results in a compressive stress at the bottom of the stack, and a tensile stress at the top of the stack. The graph of FIG. 4B plots the stress magnitude and direction (compressive, or negative stress is shown below zero and tensile, or positive stress is shown above zero) through the thickness of the layer 403 when the stack bends. Through the thickness of the layer 403 from bottom to top (plotted here left to right), the compressive stress decreases to an inflection point such that there is no stress at the center of the layer 403, and tensile stress increases from there toward a maximum at the top of the layer 403.

FIG. 4C illustrates the embodiment of FIGS. 1A and 1B in which the stack comprises at least one piezoelectric layer 403, and two layers of metal 407a and 407b. One layer of metal (407a) is located on the upper side of the at least one piezoelectric layer, and one layer of metal (407b) is located on the underside of the at least one piezoelectric layer, such that the one or more piezoelectric layers are sandwiched by the metal layers to form a stack. In the arrangement shown in FIG. 4C, the two layers of metal are composed of the same metal, and the two metal layers are of equal thickness. As shown in FIG. 4C, at T0 the stack has a radius of R, and there is no bending. As shown in FIG. 4C, at a temperature T, wherein the temperature T is greater than T0, there is a biaxial homogenous stress, and the stack expands by a radius ΔR. As shown in the graph of FIG. 4C, the stress distribution is symmetrical, such that there is positive, or tensile stress which peaks around the same amount at both the upper and bottom sides of the stack (shown as the left and right extremes of the plot, where the two metal layers 407a and 407b associate with the piezoelectric layer 403), and the stress decreases to zero at the center of the stack. The stress distribution is symmetrical, due to the metal layers being the same material and thickness in this arrangement, such that they have the same thermal coefficient of expansion, and same Young's modulus. As shown by the arrows in the center figure of FIG. 4C, there may be small lateral bending due to the stress gradient throughout the stack that is plotted in the bottom portion of FIG. 4C. Thus, the metal may pull laterally to the left and right where it contacts the piezoelectric layer 403 both above and below, causing slightly concave inward bend in that layer at its radial periphery.

Compensation Using Selected Materials

Figure 5A:
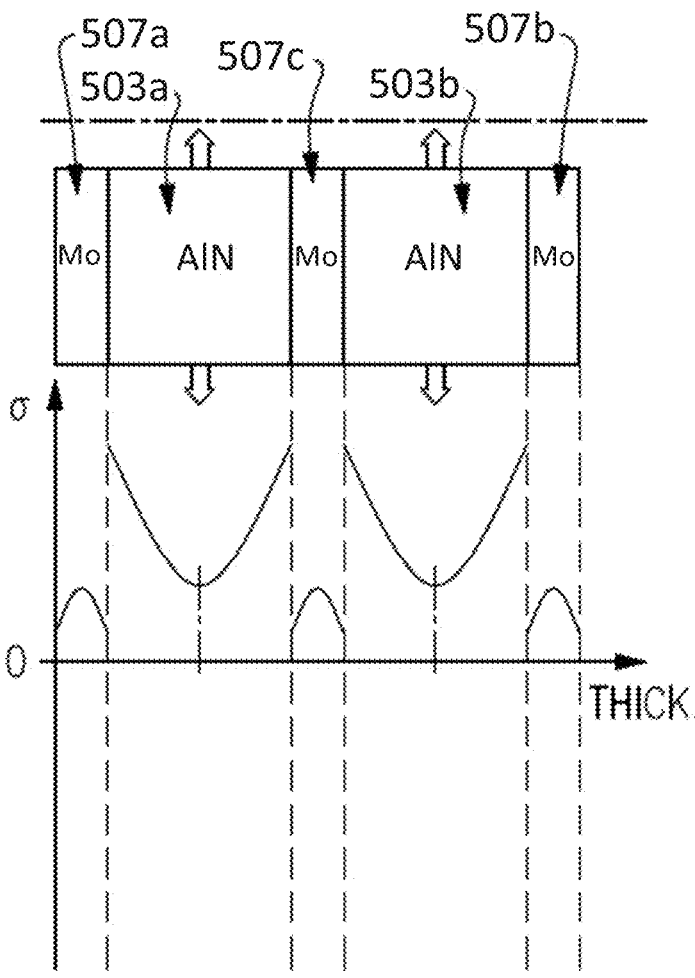
FIG. 5A-5C are cross sectional views of devices comprising different materials according to aspects of the present disclosure.
Figure 5B:
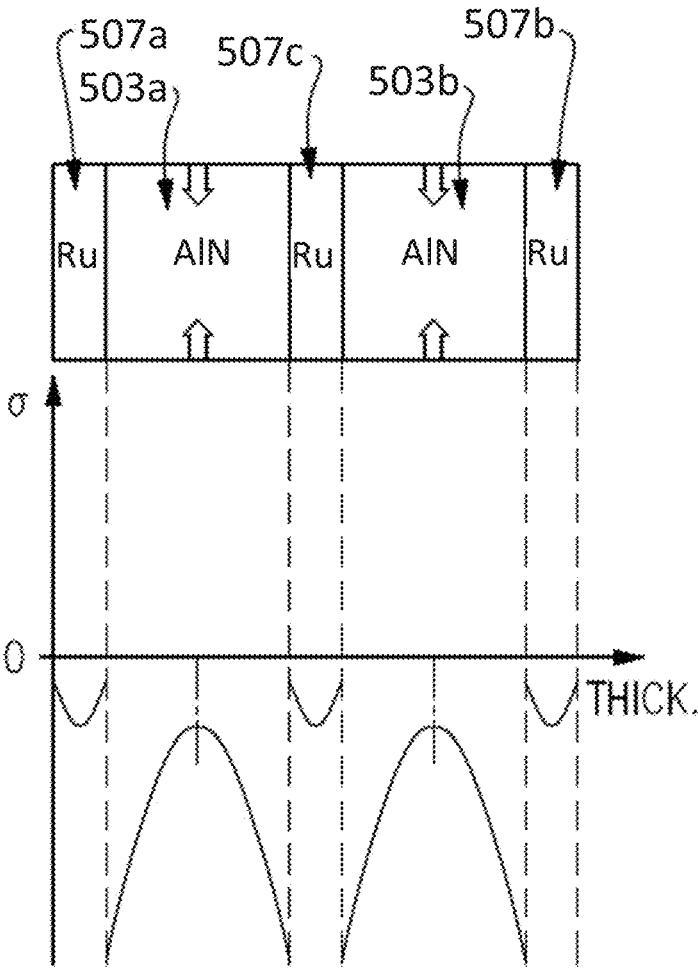
Figure 5C:
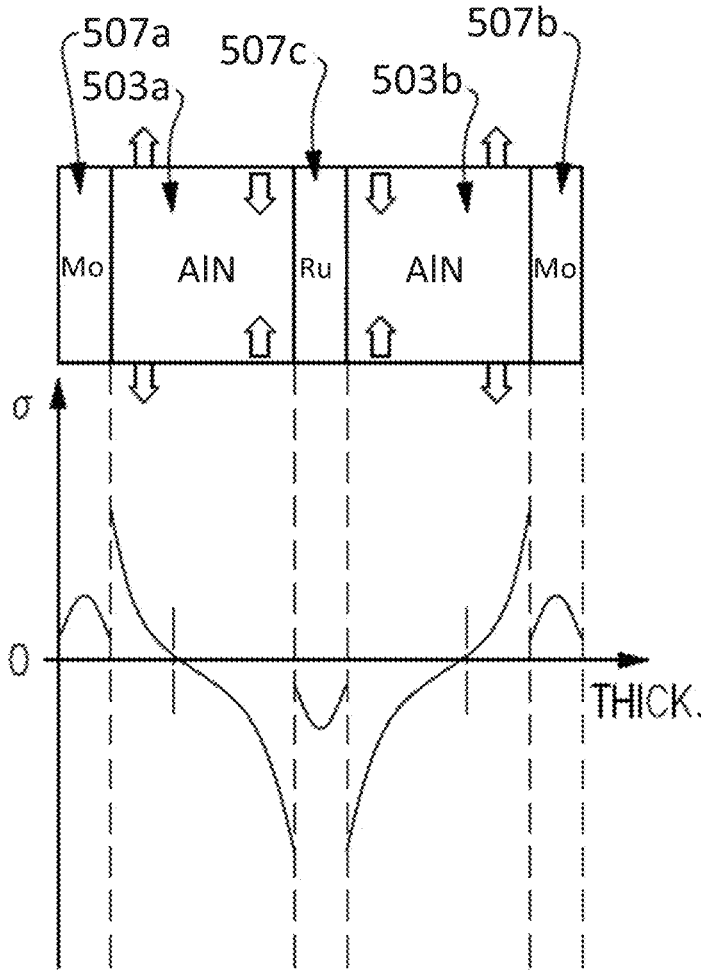

FIGS. 5A-5C show a cross sectional view of a stack according to the embodiment of FIG. 1B such that it comprises three metal layers 507a, 507b, and 507c and two piezoelectric layers 503a and 503b. This stack is unsupported, such that the results, as shown in the stress profiles, do not include the effect of a silicon or silicon dioxide support layer. In this arrangement there is a lower metal layer, middle metal layer, and an upper metal layer, each separated by a piezoelectric layer, such that the stack comprises alternating layers. The metal layers may be composed of the same metal or different respective metals, such that a first metal layer is composed of a different metal to a second layer, and a third metal layer may be composed of the same metal as either of the first or second metal layers, or may be composed of a different metal to the first and second metal layers. The two piezoelectric layers in a stack may be composed of the same piezoelectric material, or different piezoelectric materials, such that the first piezoelectric layer may be composed of the same material as the second piezoelectric layer, or the first piezoelectric layer may be composed of a different material than the second piezoelectric layer. as will be discussed herein. A graph of stress over the thickness of the stack is also shown in each of the FIGS. 5A-5C, with the left-hand side corresponding to the top and the right-hand side corresponding to the bottom of the stack as illustrated in FIG. 1B. Thus, the stack is depicted in FIGS. 5A-5C rotated 90 degrees from the depiction of FIG. 1B. The block arrows shown in the FIGS. 5A-5C illustrate the direction of the expansion at the piezoelectric layers 503a and 503b. As shown, the metal layers may be substantially thinner than the piezoelectric layers.

FIG. 5A shows an embodiment arranged similarly to FIG. 1B (three metal layers surrounding two piezoelectric layers) in which the piezoelectric layers are both composed of aluminum nitride (AlN) and the metal layers are each composed of Molybdenum (Mo). As shown in the table of FIG. 3, molybdenum and aluminum nitride have similar thermal expansion coefficients (symbol a: 4.8 and 4.9, respectively) and similar Poisson's ratio (symbol v: 0.31 and 0.29, respectively); however the Young's modulus of AlN is higher (symbol Y: 390, compared to 312 for Mo), such that AlN is a stiffer material and Mo is more elastic. Therefore, the stress expansion of AlN has more of an effect (displaces the material physically further) than Mo when they are both heated, for example to 100 degrees Celsius. The stiffer material, here, AlN, will tend to expand more than the more resilient material (here Mo). Therefore, in a stack comprising Mo and AlN, where the layers are adhered to each other or otherwise joined, the AlN will expand the Mo and the Mo will constrain the expansion of the AlN at the boundary region. Young's modulus (also known as the modulus of elasticity) is a measure of the ability of a material to withstand changes in length when under lengthwise tension or compression. Although in this arrangement the AlN has a higher Young's modulus and a slightly higher thermal coefficient of expansion, in an arrangement with two different materials with the same thermal coefficient of expansion, if one has a higher Young's modulus (that is, a lower elasticity or greater stiffness), it will exert stress on the material with the lower Young's modulus (higher elasticity, lower stiffness). Stress may also occur if there is some non-homogeneity of expansion, for example lateral effect or due to geometry or other reasons. Accounting for these various effects, the embodiment of FIG. 5A has a higher stress level (and more non-homogeneity of expansion) than the embodiment of FIG. 5B. As shown in FIG. 5A, the stress in the arrangement has a symmetrical shape, as there is symmetrical expansion on the top and bottom side, so there is no bending, as described in FIG. 4C.

FIG. 5B shows an embodiment in which the piezoelectric layers are both composed of AlN, and the metal layers are each composed of Ruthenium (Ru). As in the embodiment of FIG. 5A, the metal layers are significantly thinner than the layers of piezoelectric material. As shown in the table of FIG. 3, Ru has a much higher thermal coefficient of expansion, $9 \times 10^{-6}$ 1/K, than AlN, $4.9 \times 10^{-6}$ 1/K. Ru also has a higher Young's modulus than AlN. Therefore Ru expands more laterally (here, in the up and down direction), and applies a lateral compressive stress in the AlN. The stress in the AlN is inward, as illustrated by the block arrows of FIG. 5B, due to the expansion of the Ru layers on both the underside and top of the stack (since as recognized by Poisson's ratio, if a material is stretched, it usually tends to contract in the directions transverse to the direction of stretching). There is also homogeneous biaxial stress, as described in relation to FIGS. 4A-4C, which causes the AlN layers (like layer 403 of FIG. 4C) to expand more in the lateral direction where they join the metal layers (407a and 407b) and to expand less near the center of the piezoelectric layer (see layer 403 of FIG. 4C).

FIG. 5C shows an embodiment in which the piezoelectric layers are both composed of AlN, and the upper and lower (here, left and right) metal layers are composed of Mo, and the middle metal layer is composed of Ru. Unlike the arrangements of FIGS. 5A-5B, the stress profile of the stack is different due to one of the metal layers being composed of a different material than the other two metal layers. As described in relation to FIG. 5A-5B, the use of Ru and Mo result in opposite stress on the piezoelectric AlN layers, with Ru resulting in net compressive lateral stress in AlN, and Mo resulting in net expansive or tensile lateral stress in AlN. Therefore the combination of metal layers of Mo with Ru results in a compensated stress gradient. As shown by the block arrows in FIG. 5C, and the stress profile in FIG. 5C, the sections of AlN adjacent the Mo have a tensile stress, and the sections of AlN adjacent the Ru have a compressive stress, with a section of the AlN having balanced or offsetting lateral stress (where the plot crosses zero). It will be understood that the section of AlN with balanced, or zero net lateral stress is not in the center of the AlN layer, as Ru has a much higher thermal coefficient of expansion and Young's modulus than Mo. Therefore, the section of AlN in which there is balanced or zero stress is closer to the Mo layer than the Ru layer. As shown, the use of different metal layer materials in the stack may enable the compensation for deflection in the membrane from other causes such as temperature.

Although not shown, different thicknesses of layers may also be used to compensate for a differences in thermal coefficient of expansion between layered materials. For example, in an arrangement in which the metal layer layers have a lower thermal coefficient of expansion than the piezoelectric layers, thicker metal layers may be used so that the difference in thermal coefficient of expansion may be compensated or offset at least to some degree.

Figure 6B:
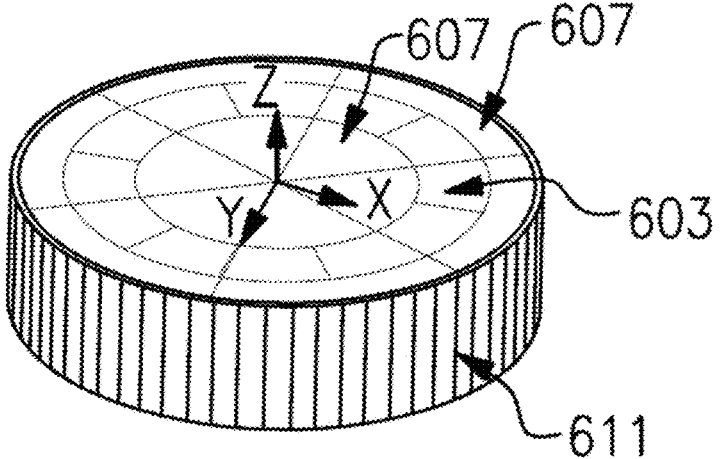
FIG. 6B is a perspective view of a device according to aspects of the present disclosure.

FIG. 6A is a table of properties of the silicon dioxide which supports the membrane, as described in relation to FIG. 6B.

FIG. 6B shows a perspective view of the embodiment of FIG. 1B, using a thermal finite element model (FEM model), in which the membrane comprises a first, second and third metal layer, surrounding first and second piezoelectric layers as described in relation to FIG. 1B. In the view of FIG. 6B the underlying layers of piezoelectric material and metal are not shown. Instead, the radially inner and radially outer electrodes of the upper metal layer 607 are show, and between the outer perimeter of the inner electrode and the inner perimeter of the outer electrode there is a section of piezoelectric layer 603 exposed. In this embodiment the membrane is supported by a silicon dioxide layer 611 from the underside (see cavity walls 109 in FIG. 1B). The silicon dioxide is cylindrical in shape, such that there is a circular side wall located underneath the perimeter of the membrane. On the inside of the side wall, there is located a cavity. The cavity may be any shape, such that in an embodiment in which the cavity is rectangular, there may be four side walls wherein one side wall meets a second at a right angle. As described herein, stress in the membrane will cause stress and potentially displace portions of a membrane. In this embodiment, in which the membrane is supported from the underside at the walls, the membrane will tend to deflect in the direction of z axis, i.e. upwards or downwards. In a device there may be a silicon substrate, onto which the silicon dioxide layer is deposited. The silicon dioxide has the properties as listed in the table of FIG. 6A. However, in some arrangements the silicon does not affect the membrane expansion, and therefore it is not included in the simulations for the expansion of the membrane, as will be discussed herein.

In some embodiments of the illustrated device, the piezoelectric layer 603 is 300 nanometers thick, the metal layers, i.e. electrodes 607, are 30 nanometers thick, the silicon dioxide 611 is 3 micrometers thick, and the radius of the membrane is 400 micrometers. The membrane is supported by the silicon dioxide walls, and thus there is an overlap (see the anchor region 113 of FIG. 1B) between the silicon dioxide and membrane of around 2 to 3 micrometers. As shown, there are inner and outer electrodes, as described in relation to FIGS. 1A and 1B. The silicon dioxide, membrane and metal layers may be separated into sections, shown shaped like wedges in this figure, wherein the metal layers for the sections may be different. In the arrangement used here, the inner and outer electrodes are composed of the same material, and the sections of electrodes are composed of the same material.

FIGS. 7A-10B show a perspective view of an embodiment in which the microphone comprises a membrane with two piezoelectric layers and three metal layers. FIG. 7A-10B also show a graph of the deflection of a thermal FEM model (across an example section of the circular membrane passing through its center) starting from an ambient temperature of 24 degrees Celsius and heated to a temperature of 200 degrees Celsius. The simulation of the model includes Young's modulus, thermal coefficient of expansion, and Poisson's ratio of all of the materials in the microphone. The figures show the deflection of the membrane at 200 degrees Celsius. However, it will be appreciated that there will be thermal expansion and therefore deflection at a lower temperature than this, such as in a device being used at a normal operating temperature. The thermal expansion and thermal coefficient of expansion compensation techniques, as described herein, will work up until there is a phase change, (e.g., the materials form a liquid or gas). If the materials in the illustrated embodiments are heated to much that they melt or evaporate, for example, these compensation techniques will likely lose their effectiveness.

FIGS. 7A, 8A, 9A and 10A do not use the technique of thermal compensation as described herein, instead having a membrane in which the first, second and third metal layers are composed of the same metal as each other, and the first and second piezoelectric layers are composed of the same material as each other. This data can be used as "control" data for comparison purposes. FIGS. 7B-7C, 8B-8C, 9B-9C, and 10B use the technique for thermal compensation as described herein, such as the embodiment of FIGS. 1B 5C, and 6B, wherein the first and second metal layers are composed of different metals with different properties, and the third metal layer is composed of the same or different metal as the first and/or second metal layers. The first and second piezoelectric layers may be composed of the same or different materials. Thus, compensation for thermal expansion can be achieved by fine-tuning the relative properties of layers in the stack, while maintaining the underlying properties (piezoelectric, conductive, etc.) that enable the underlying function of the microphone.

Figure 7A:
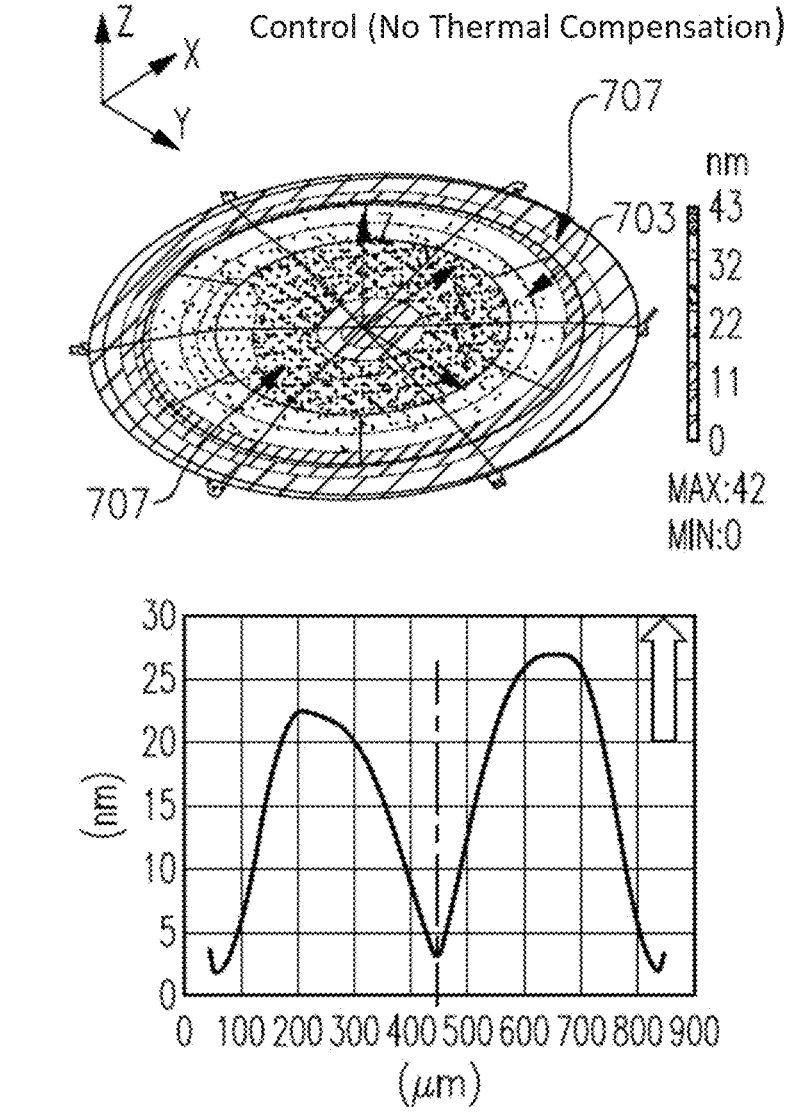
FIG. 7A-7C are perspective views and graphs of stress in devices according to aspects of the present disclosure.

FIG. 7A shows results of a membrane formed from a stack comprising three layers of metal formed from Molybdenum (Mo) and two layers of piezoelectric material formed from Scandium doped Aluminum nitride (Sc(0.2)AlN), wherein the metal layers and piezoelectric layers are alternating, as described in other embodiments herein. The deflection is shown in the contour diagram and the graph of FIG. 7A. The deflection shown by the graph, is the deflection taken along the line A as shown in the perspective view. As shown, the membrane does not only deflect up, so that there is no peak in the center. Instead, there is a reduction of deflection in the center region, and as the stack is symmetrical, there are two peaks, as shown in the figure. The maximum deflection is 42 nanometers. In this arrangement the deflection peaks around 25 nanometers either side of the center of the membrane.

Figure 7B:
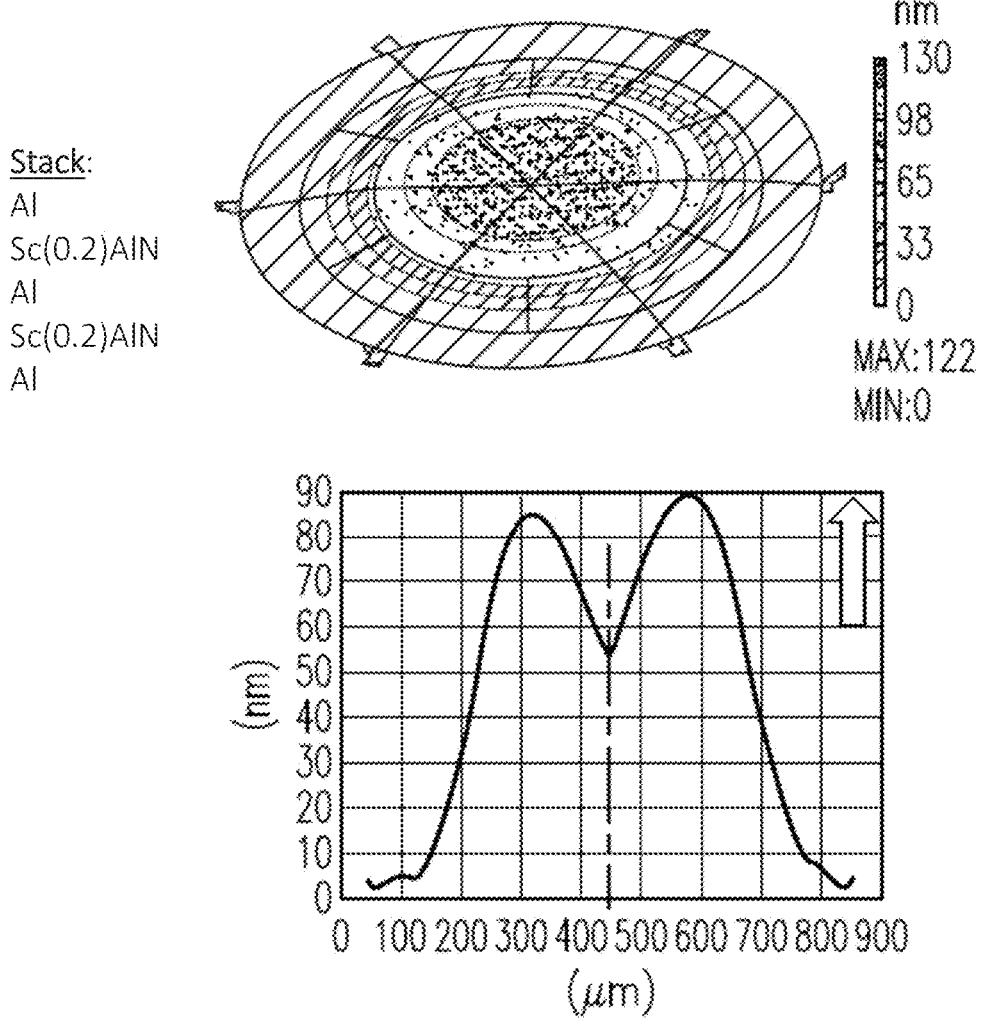

FIG. 7B shows the results of a stack wherein the three metal layers are composed of Aluminum (Al), and the two piezoelectric layers are composed of Sc(0.2)AlN. As shown in the table of FIG. 3, Al has a lower Young's modulus than Sc(0.2)AlN (75 Gpa compared to 390) but it has a higher thermal coefficient of expansion (23.1 10e-6 1/K compared to 4.9 10e-6 1/K). therefore, the stress profile is different to that of the embodiment of FIG. 7A. In this arrangement, the deflection is much larger, with two peaks either side of the center of the membrane, each peak around 90 nanometers, and the center of the membrane has less of a reduction of deflection.

Figure 7C:
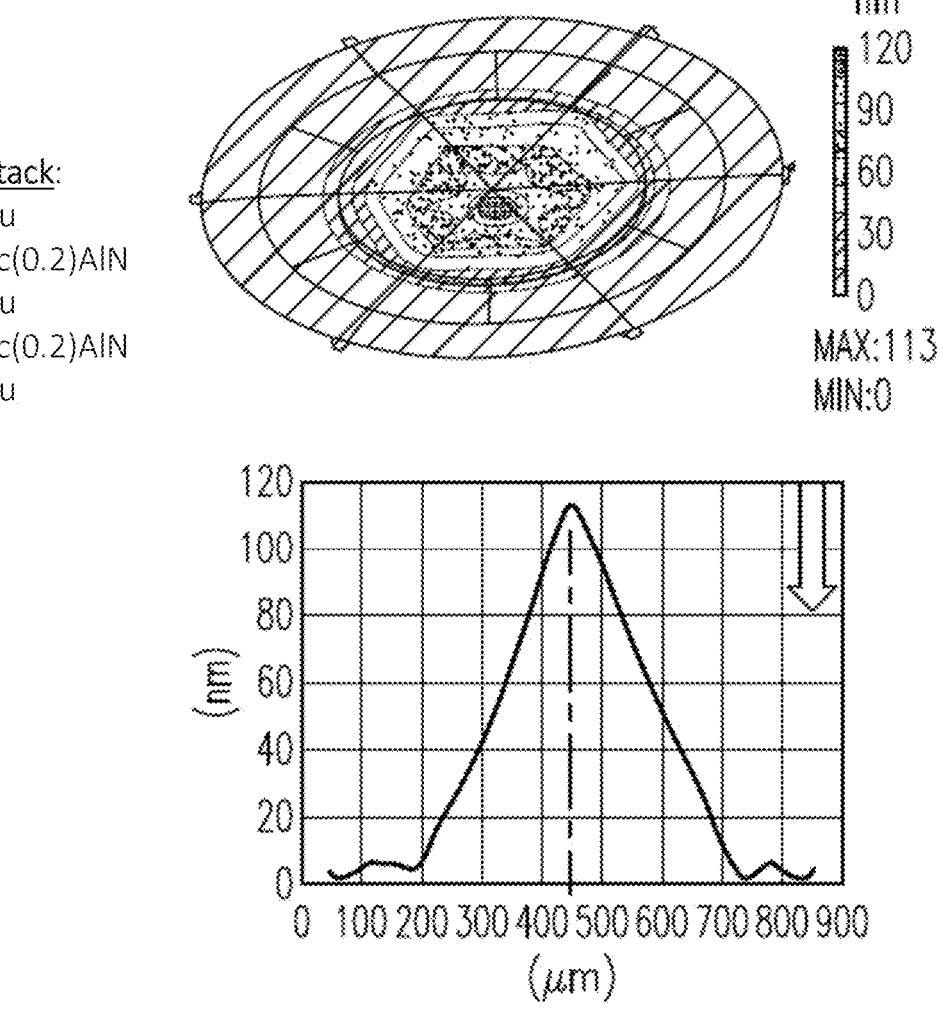

FIG. 7C shows the results of a stack wherein the three metal layers are composed of Ruthenium (Ru) and the two piezoelectric layers are composed of Sc(0.2)AlN. The deflection of this arrangement is a downward deflection, due to the stress as shown and described in FIG. 5B. this stress profile only has a single peak as Ruthenium produces a much higher stress than the Sc(0.2)AlN in this stack, and therefore the stress concentrates in the center region. This stress then relaxes laterally, such that the deflection away from the center of the membrane is around 0 nanometers. Although the opposite direction, the magnitude of the deflection of the membrane in this arrangement is similar to that of the membrane of the arrangement in FIG. 7B. Therefore, the combination of these two arrangements may result in a compensation of the deflection. It will be noted that the deflection profile after compensation significantly depends on the structure, geometry, and material parameters used, and therefore these will need to be optimized for each individual device to optimize compensation.

Figure 8A:
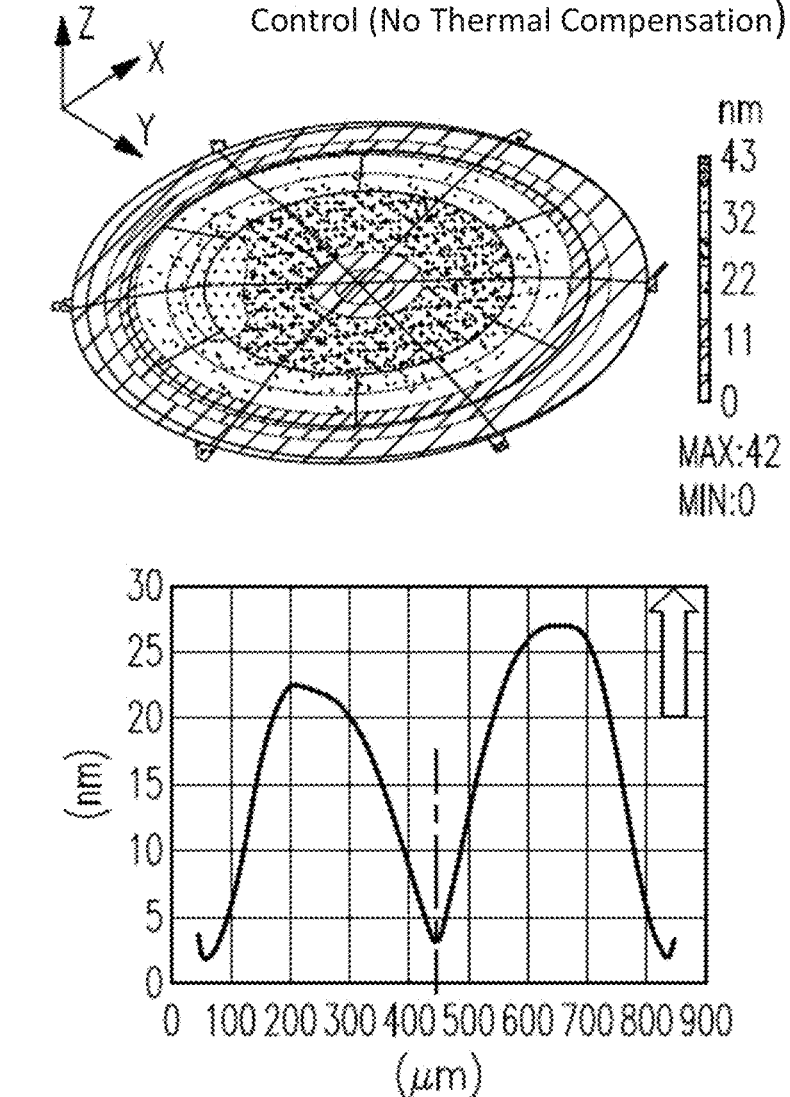
FIG. 8A-8C are perspective views and graphs of stress in devices according to aspects of the present disclosure.
Figure 8B:
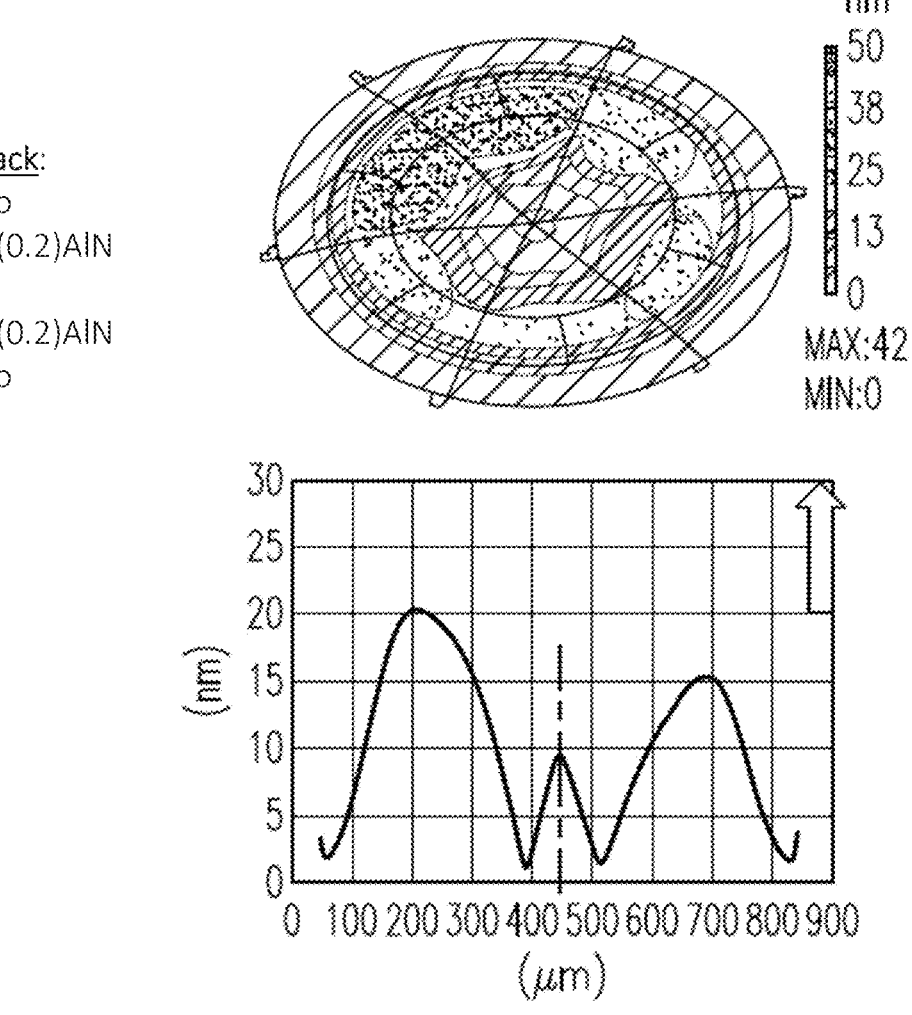
Figure 8C:
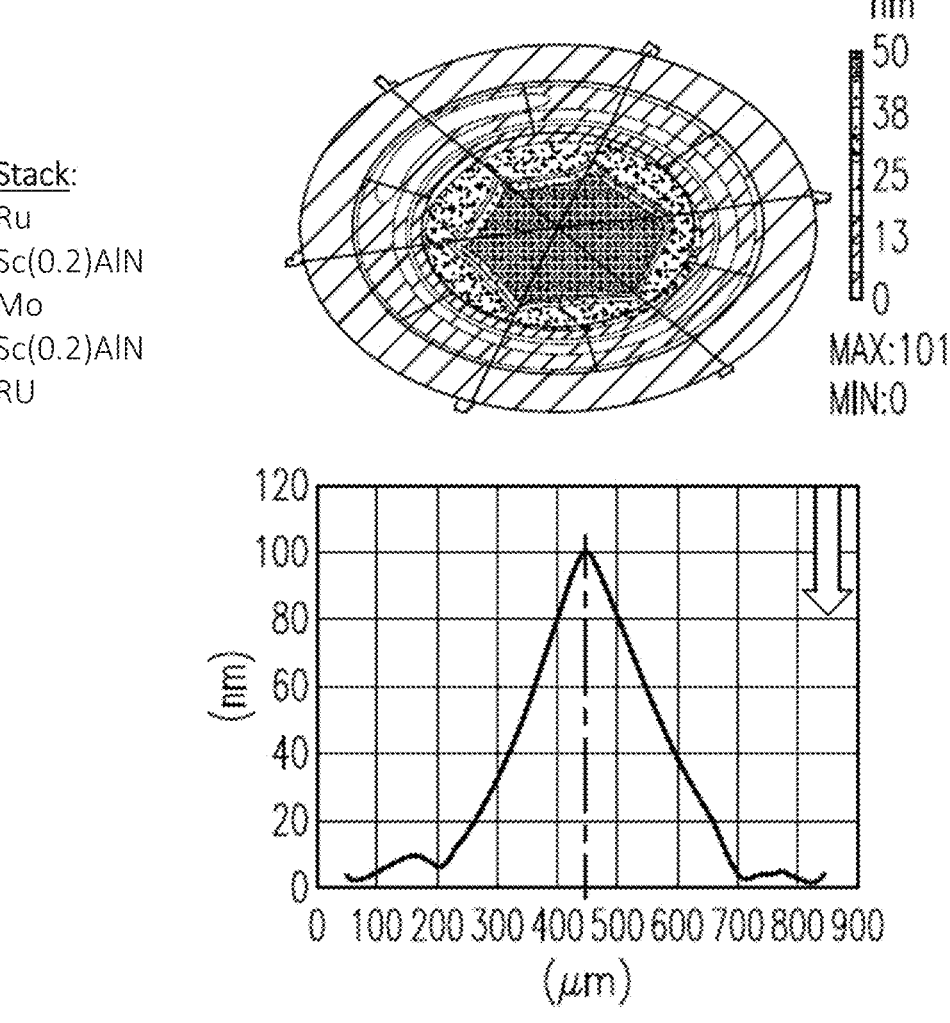

FIG. 8A shows the results of a stack of Mo and Sc(0.2) AlN exactly the same as shown in FIG. 7A, used as a reference for ease of comparing the results of FIGS. 8B and 8C.

FIG. 8B shows the deflection of a stack comprising two layers of piezoelectric material, wherein the piezoelectric layers are composed of Sc(0.2)AlN. The stack also comprises three metal layers, wherein the upper and lower metal layers are composed of Mo, and the middle metal layer is composed of Ru. Comparing the results from FIG. 8A and FIG. 8B, the use of a Ru middle metal layer results in a different stress distribution, wherein there are three peaks in the deflection profile, one either side of the center of the membrane, and one around the center of the membrane. The deflection of the membrane in this embodiment is around 7 nanometers smaller, in the upwards direction, and therefore the stress has been compensated by the use of the Ru middle metal layer. This is due to Ru producing a much higher stress in the opposite direction to the stress produced by the Mo layers.

FIG. 8C shows the deflection of a stack comprising two Sc(0.2)AlN piezoelectric layers, and an upper and lower metal layer composed of Ru, and a middle metal layer composed of Mo. The resulted deflection is similar in profile to that in the arrangement of FIG. 7C, wherein there is one peak around the center of the membrane, and the deflection is down into the cavity. The reason for this shape as the same as the shape in FIG. 7C. Comparing the results of the arrangement of FIGS. 7C and 8C, it will be shown that the deflection of the membrane of FIG. 8C is smaller, with a peak around 100 nanometers. Therefore, the use of a Mo middle metal layer has provided some compensation to the stress, but as Ru has a much higher thermal coefficient of expansion and young's modulus than Mo, and therefore the Mo layer only has a very small effect on the stress profile.

Figure 9A:
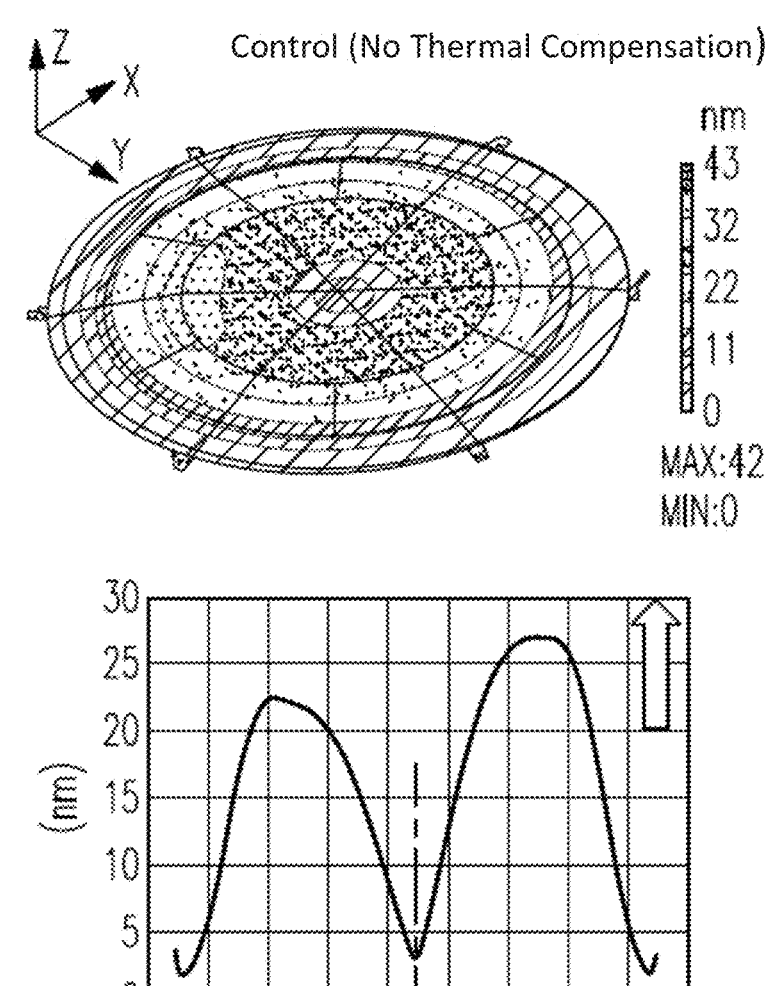
FIG. 9A-9C are perspective views and graphs of stress in devices according to aspects of the present disclosure.
Figure 9B:
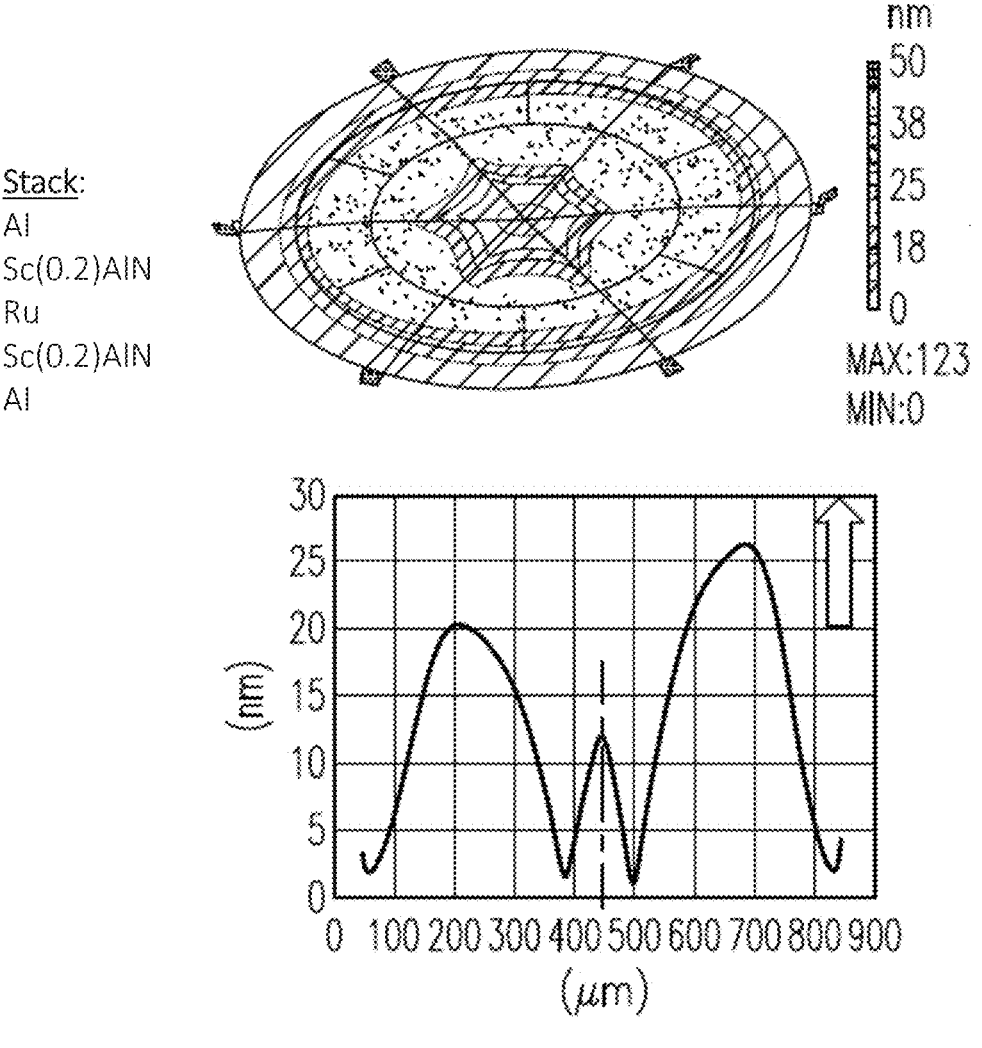
Figure 9C:
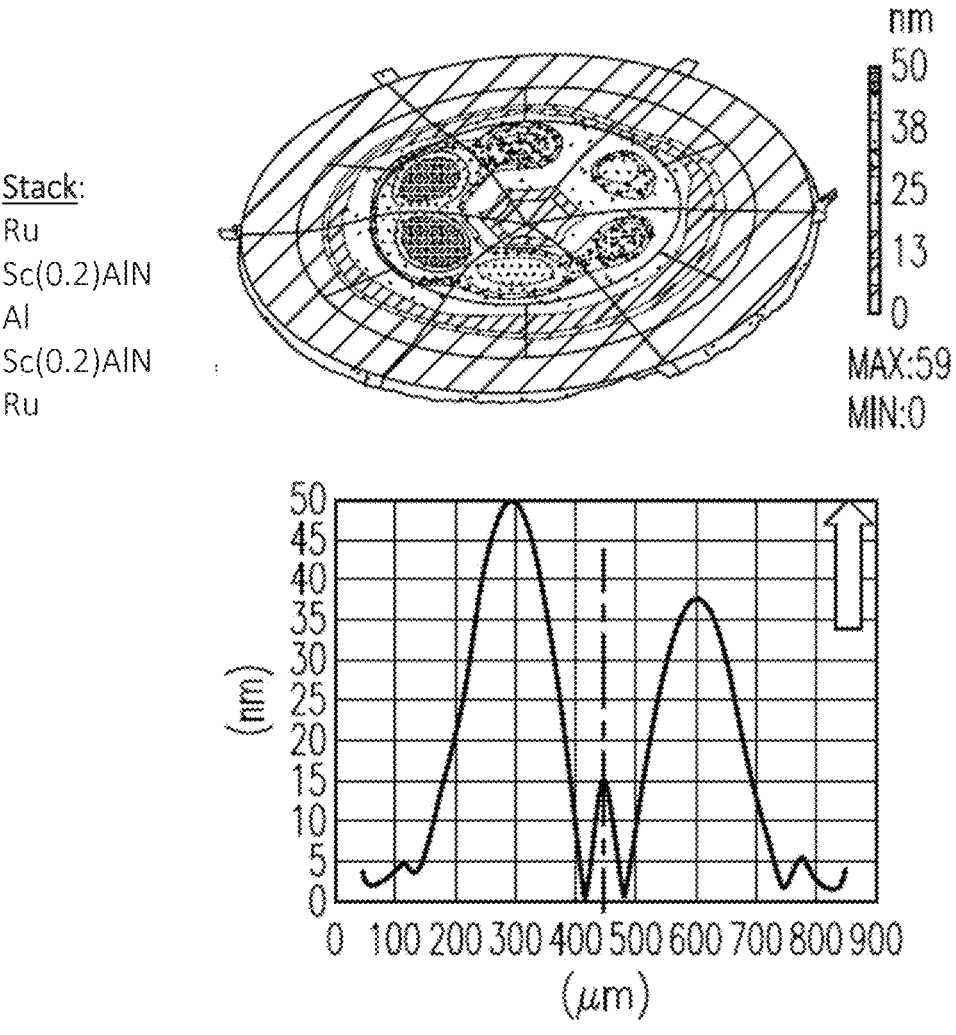

FIG. 9A shows the results of a stack of Mo and Sc(0.2) AlN exactly the same as shown in FIGS. 7A and 8A, used as a reference for ease of comparing the results of FIGS. 9B and 9C.

FIG. 9B shows the results of a stack comprising two piezoelectric layers composed of Sc(0.2)AlN, and an upper and lower metal layer composed of Aluminum, and a middle metal layer composed of Ru. This combination results in a similar deflection to the stack comprising three layers of molybdenum such that the deflection is upwards, shown in FIG. 9A, but the distribution includes compensation. As shown, the Ru middle metal layer results in a peak around the center of the membrane, and also results in the stress being redistributed away from the center. This is shown by the movement of the two peaks either side of the center, which are further out than the peaks of the distribution of FIG. 9A.

FIG. 9C shows the results of a stack comprising upper and lower metal layers composed of Ru, and a middle metal layer composed of Al. As shown, this results in a larger deflection of the membrane, with two peaks being formed either side of the center of the membrane, with a deflection of around 50 nanometers. There is also a compensation, resulting in a central peak. Due to the high Young's modulus of the Ru, resulting in stiff upper and lower layers of the stack, the maximum peaks of displacement are moved closer to the center of the membrane, due to the Ru layers forcing the stress towards the center.

Figure 10A:
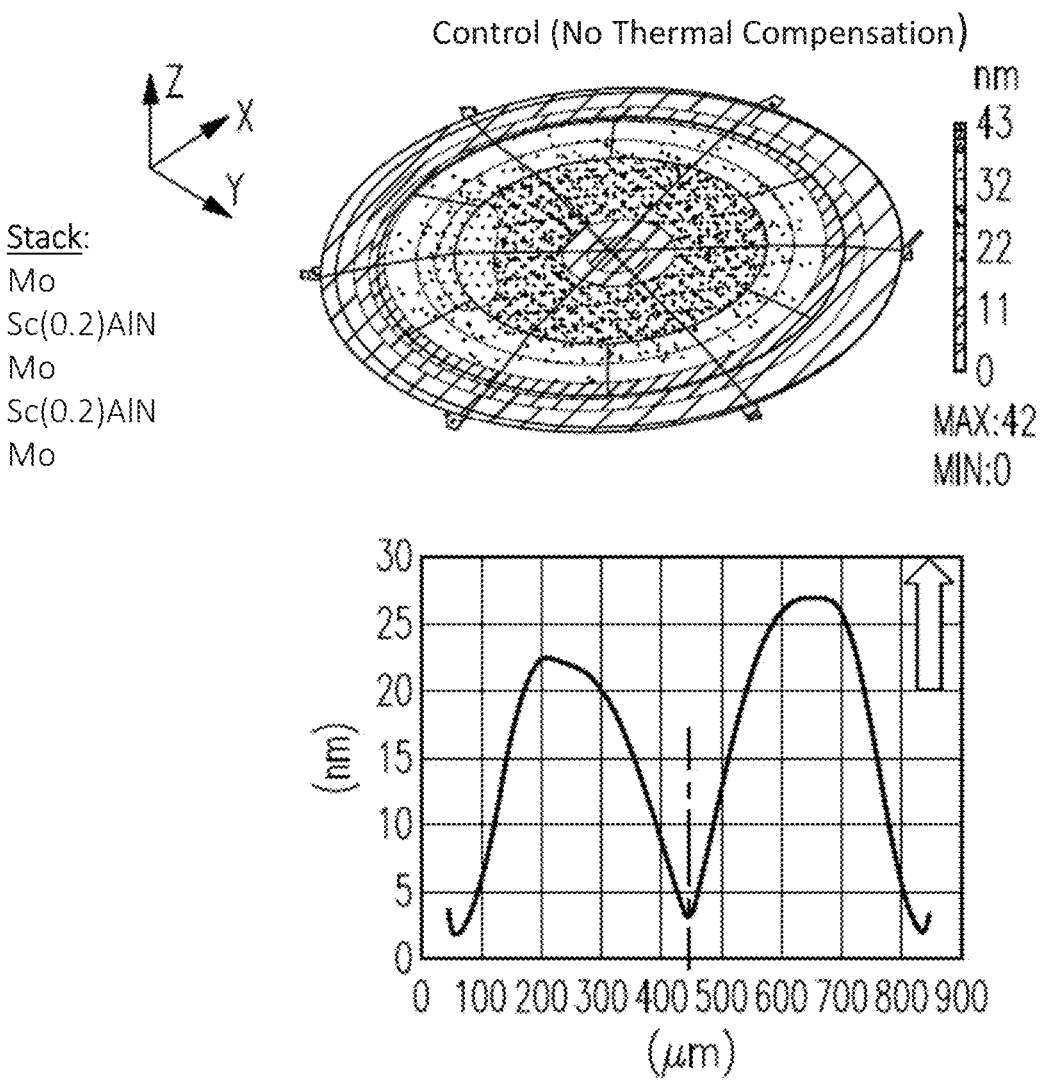

FIG. 10A shows the results of a stack of Mo and Sc(0.2) AlN exactly the same as shown in FIGS. 7A, 8A and 9A, used as a reference for ease of comparing the results of FIG. 10B.

FIG. 10B shows the results comprising an upper metal layer composed of Ru, and a middle and lower metal layer composed of Mo. The stack also comprises two piezoelectric layers composed of Sc(0.2)AlN. As shown, this arrangement results in a compensated deflection profile, wherein there is a single peak around the center of the membrane. The peak of the deflection is around 3 nanometers in the downward direction, i.e. into the cavity. This small deflection is due to the high Young's modulus and thermal coefficient of expansion of the Ru on the upperside of the stack. The Ru deflects downwards, as described in other embodiments herein, and the two layers of Mo expand upwards, as also described in other embodiments herein. Although there are two layers of Mo and only one layer of Ru, the Ru has a much higher expansion coefficient and Young's modulus than Mo, as shown in the table in FIG. 3. Therefore, in this arrangement, the deflection is compensated.

There are embodiments using other combinations of material, which have similar Young's moduli and thermal coefficients of expansion which have not been described here. Furthermore, different combinations of metal layers may be used to compensate each other, wherein one of the three metal layers is a different material than the other two. Varying the embodiment of that in FIG. 10B to comprise two Mo metal layers, and one Ru metal layer, wherein the Ru is the lower metal layer, may result in a different stress and deflection profile. A Ru metal layer located on the bottom of the stack would support the membrane from the bottom, due to the higher stiffness of Ru compared to Mo. This would result in the upper direction being free for membrane deflection. Deflection in a membrane is not only characterized by stress in a free membrane; instead, the laterally constrained effect must be taken into account. Therefore, a membrane supported from the underside can have a significant deflection.

Compensation Using Selected Thicknesses

As described in FIGS. 5A-10B, the stress and deflection of a membrane due to thermal expansion may be compensated using different materials for the metal layers, which may be chosen such that there is an optimal or improved combination for compensating the deflection for the device (e.g., from available materials having the desired acoustic reaction properties). Additionally, or alternatively, stress and deflection may be compensated by optimizing the thickness of metal and/or piezoelectric layers. This compensation may be used to precisely optimize the deflection in addition to the different layer materials being chosen to optimize the device. FIGS. 11A-11D show a cross sectional view of bimorph structures, i.e. stacks comprising alternating layers of metal and piezoelectric material, in which different relative thicknesses of any or all of the layers may be used. The stack of layers in FIGS. 11A-11D may be according to the embodiment of FIGS. 1B and 6B, in which the metal layers may be composed of the same or different metals, in various combinations of thicknesses and/or materials.

Figure 11A:
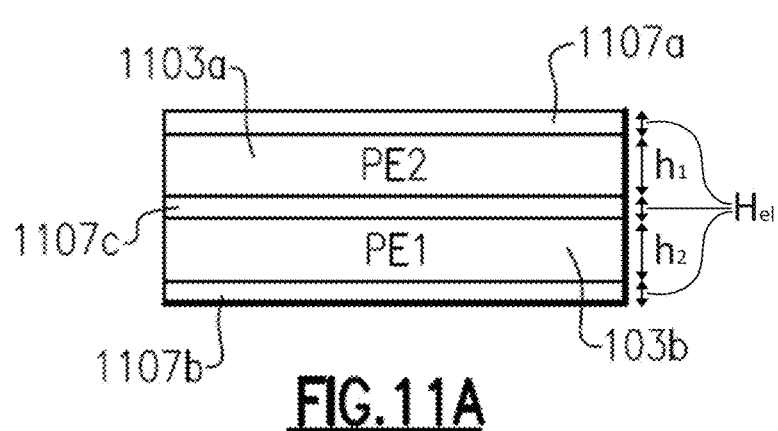
FIG. 11A-11D are cross sectional views of piezoelectric and metal layers according to aspects of the present disclosure.

FIG. 11A shows a symmetrical bimorph structure in which the three metal layers all have equal thickness, $H_{el}$, and the piezoelectric layers both have equal thickness, $h_1=h_2$. The ratio of the thickness of the metal layers to the thickness of the piezoelectric layers may be optimized to compensate for expected or measured stress and deflection of the membrane. This symmetric structure may be used when different materials are employed for the metal layers, and the choice of piezoelectric to metal layer thickness can provides a satisfactory compensation for stress and deflection.

Figure 11B:
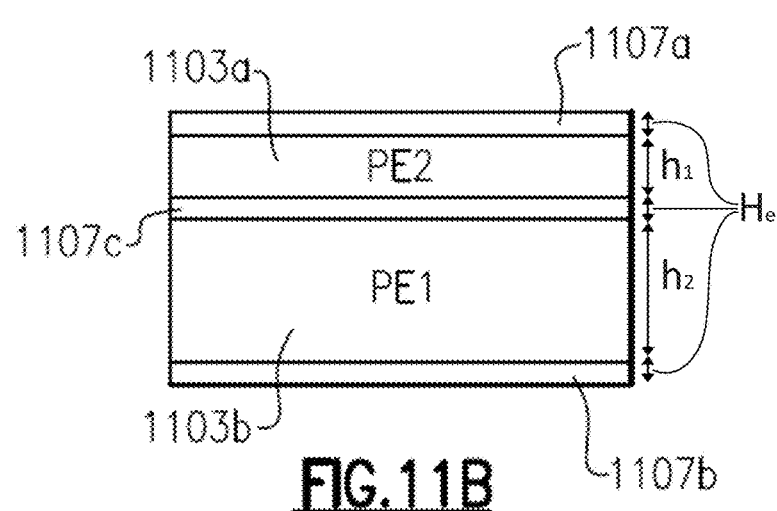

FIG. 11B shows an embodiment of an asymmetrical bimorph structure in which the metal layers are all equal in thickness, $H_{el}$=const. In the embodiment of FIG. 11B the piezoelectric layers are not equal thicknesses, $h_1 \neq h_2$. As shown in FIG. 11B the lower piezoelectric layer may be thicker than the upper, or it will be appreciated that the upper piezoelectric layer may be thicker than the lower. This embodiment may be used to optimize the deflection via the piezoelectric layer thicknesses. The thicknesses may be chosen dependent on the metal layer and piezoelectric layer properties, such as thermal coefficient of expansion, and Young's modulus.

Figure 11C:
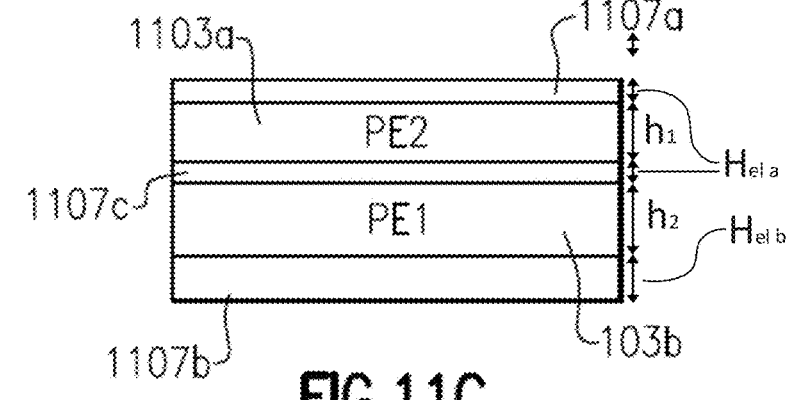

FIG. 11C shows an embodiment of an asymmetrical bimorph structure in which the metal layers are of different thicknesses, $H_{el} \neq$const ($H_{el\,a} \neq H_{el\,b}$). The piezoelectric layers in this embodiment are equal in thickness, $h_1=h_2$. It will be appreciated that although shown as a stack in which two of the metal layers are equal in thickness, in some embodiments none of the metal layers may be equal in thickness. It will be appreciated that although the bottom metal layer is shown as thicker than the middle and upper metal layers, there may be any combination of different thickness of metal layers, for example, the middle metal layer may be thicker in some embodiments. This embodiment may be used to optimize the deflection via the metal layer thicknesses. The thicknesses may be chosen dependent on the metal layer and piezoelectric layer properties, such as thermal coefficient of expansion, and Young's modulus. For example, in a situation in which the membrane is being deflected due to a middle metal layer resulting in too much stress, this metal layer may be chosen to be thinner to optimize the deflection compensation.

Figure 11D:
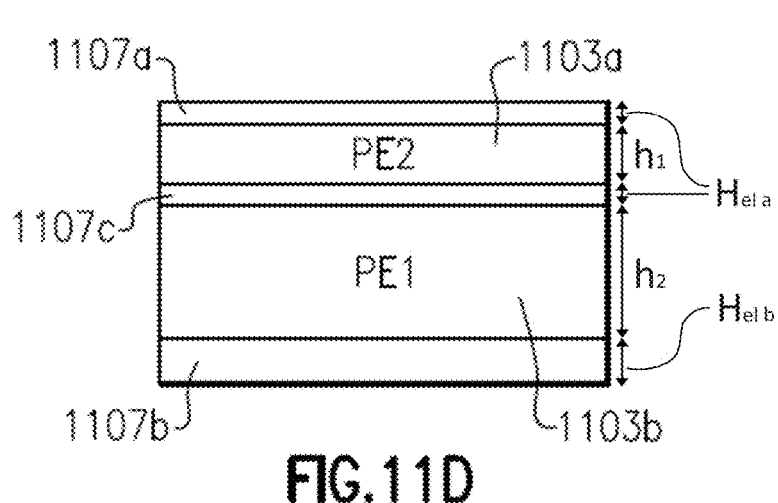

FIG. 11D shows an embodiment of asymmetrical bimorph structure in which the metal layers are of different thicknesses to each other, and the piezoelectric layers are of different thicknesses to each other, $H_{el} \neq$const ($H_{el\,a} \neq H_{el\,b}$), and $h_1 \neq h_2$. It will be noted that two of the metal layers may be the same thickness, or all three of the metal layers may be of different thicknesses. This embodiment enables the stress and deflection to be optimized via metal and piezoelectric layer thicknesses.

Although it may be possible to compensate the stress and deflection of the device by varying the thickness of the piezoelectric layers and/or metal layers, this may affect the performance of the microphone. In a piezoelectric MEMS device, charge is generated due to an external sound pressure and the resultant membrane deflection. However, when the external sound is constant, the sensor deflection depends on compliance of the sensor, or the thickness of the layer and its stiffness (e.g., Young's modulus). Therefore, properties and dimensions of the layers in the microphone may affect the device's performance. In a microphone in which the piezoelectric layer is too thick, this results in a low compliance and therefore a low deflection which results in a low output. In a microphone in which the metal is too thick, there is also a low output, since the metal layers can change the net stiffness of the device (for similar reasons as the too thick piezoelectric layer). In a microphone in which very thin metal and piezoelectric layers are used, there may be too high a compliance, resulting in a stack which easily breaks, has a low resonant frequency in the acoustic range, and therefore may not be a good sensor. Therefore, the stack can be optimized or improved by taking into account the above and the necessary parameters of a sensor. Thinner electrodes may be preferable as they increase compliance and reduce stiffness. Furthermore, when the thickness of piezoelectric layers is changed, the stress is changed, and consequently the charge is changed, and so the electrode structure, e.g., metal layers, may need to be reconfigured or re-optimized. This re-optimization of metal layers may be especially helpful as the change in charge may result in an electrode from a positive section overlapping a piezoelectric area that produces negative charge distribution. This results in a reduced output signal, which can result in a zero output. Therefore, when altering the thickness of the piezoelectric layers to optimize the deflection, it may be preferable to use this technique to fine tune the results, and not vary the thickness by large enough amounts to affect the performance of the microphone due to charge generation.

A change in metal layer thickness may also affect the performance of the microphone. An increase in thickness of a metal layer may increase the mass loading effect. An increased thickness may also reduce the resonant frequency of the sensor. This is not preferable for most microphones, which are generally required to have a high resonant frequency for higher acoustic range. However, this may not be a problem when altering the thickness a small amount to fine tune the deflection and stress.

Figure 12A:
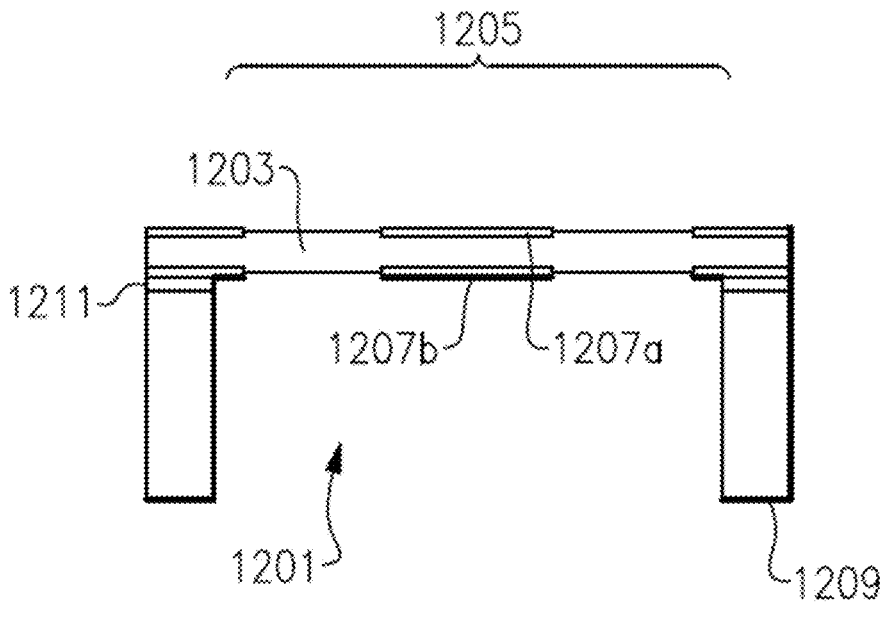
FIG. 12A-12B are cross sectional views of devices according to aspects of the present disclosure.

FIG. 12A shows a cross sectional view of an embodiment in which the membrane 1205 comprises one piezoelectric layer 1203, and two layers of metal layers 1207a and 1207b. As described above, the membrane is supported by cavity walls 1209, which define a cavity 1201, and between the cavity walls and the membrane is located a silicon dioxide layer 1211. As described herein, the metal layers may be composed of different metals, to compensate for stress and deflection of the membrane due to thermal effects. Furthermore, the device may be finely tuned by changing the thickness of the piezoelectric layer and/or thickness of one or more of the metal layers, as described in relation to FIGS. 11A-11D.

Figure 12B:
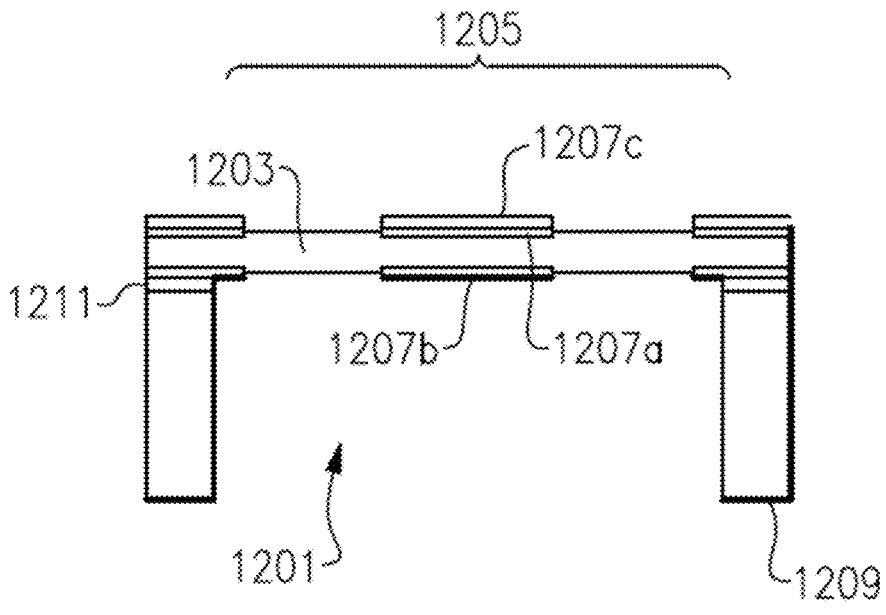

However, in an embodiment having only two metal layers, the opportunities to compensate the stress and deflection are less than in an embodiment with three metal layers, although residual stress control and prediction of compensation are simpler for smaller numbers of layers in the stack. Therefore, in some embodiments, as shown in the cross-sectional view of FIG. 12B, there may be an additional layer of metal 1207c, deposited on top of the upper metal layer 1207a. This additional layer of metal 1207c may be chosen specifically to fine tune the compensation of the stress and deflection of the membrane 1205. For example, a layer of Ru may be deposited on top of a layer of Mo. In an embodiment in which the lower metal layer is composed of Mo, this may result in a compensation similar to that shown in the embodiment of FIG. 10B. This additional layer can result in a mass loading effect which may be advantageous for light materials. However, in embodiments in which there is an additional (e.g., third) layer of metal deposited on top of the upper metal layer, a delamination problem may arise due to a bad contact between two metals. Therefore, the metals (and or coatings or other properties) in this embodiment are advantageously chosen to minimize this problem. Additionally, embodiments using an extra layer of metal may improve thermal stability of the microphone device in high temperature applications because the metal layer can provide heat sink or dispersion functionality. Some metals, such as Aluminum, have relatively low melting points, which may result in problems in microphones which are used at high temperatures. The addition of another layer of metal can improve this by changing the collective or net melting point of a combination of layers.

Further to the advantages of the methods and devices described above, enhancement and/or optimization of a device by using different materials of metal layers can also improve the quality of the membrane formed. In the use of materials, such as aluminum nitride, there are considerations which may be taken into account when forming the device, such as the grain size and direction of growth of the layer of the aluminum nitride. Due to this, the quality of the aluminum nitride layer is dependent on the substrate, or support material. Using the methods and techniques described herein, it is possible to optimize the membrane and thus performance of the microphone by choosing materials which provide the best results when used together. For example, aluminum nitride and ruthenium both have hexagonal crystal structures, and therefore, using the techniques described herein, it is possible to deposit the aluminum nitride on a ruthenium layer, resulting in a better device. Considering different physical properties of materials used for the piezoelectric layers and metal layer layers, the combined structure can enhance or optimize the device.

The techniques described here are also applicable to any number of layers, so that the device is not limited to two piezoelectric layers and three metal layers. Instead, these techniques may be applied to other layered devices.

Figure 13:
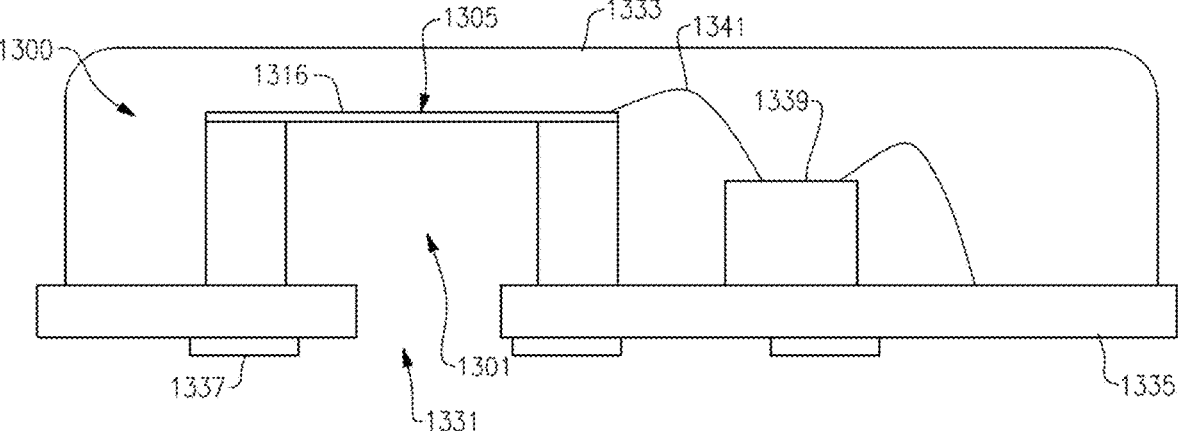
FIG. 13 is a cross sectional view of a microphone arrangement in accordance with the present disclosure.

FIG. 13 illustrates a cross sectional view of a microphone arrangement comprising the microphone of embodiments described herein. It will be appreciated that this is an example embodiment for illustrative purposes, and the microphone can be included in a variety of different arrangements. As illustrated, the microphone 1300 of FIG. 13 is located within a cap 1333. The cap may be flexible or rigid, and may be any suitable material such as a metallic material. The cap creates a seal with a substrate 1335 (for example a printed circuit board), such that air only flows into and out of the arrangement via a sound inlet 1331. The substrate 1335 may be any suitable material. The cap 1333 also mitigates electromagnetic interference. Sound waves enter the arrangement, causing the membrane 1305 to bend and produce voltage due to the piezoelectric effect, as described herein. The arrangement comprises at least one solder pad 1337 such that the microphone arrangement may be soldered to external devices, not shown here. The microphone arrangement further comprises an application specific integrated circuit chip/die ("ASIC") 1339. The MEMS microphone is electrically connected by wire bonding 1341. Although not shown, it will be appreciated that the wire bonding may be connected to the one or more metal layers of the microphone, as described herein.

It will be noted that FIG. 13 is a cross sectional view of the microphone arrangement, such that the one or more solder pads 1337, substrate 1335, MEMS microphone 1300, ASIC 1339, and cap 1333 extend into and out of the page such that they are three-dimensional, as described in relation to other embodiments disclosed herein.

The microphone according to embodiments described herein may be manufactured according to the method whose steps are shown in FIGS. 14A-14E, which are a cross sectional view of the microphone.

Figures 14A, 14B:
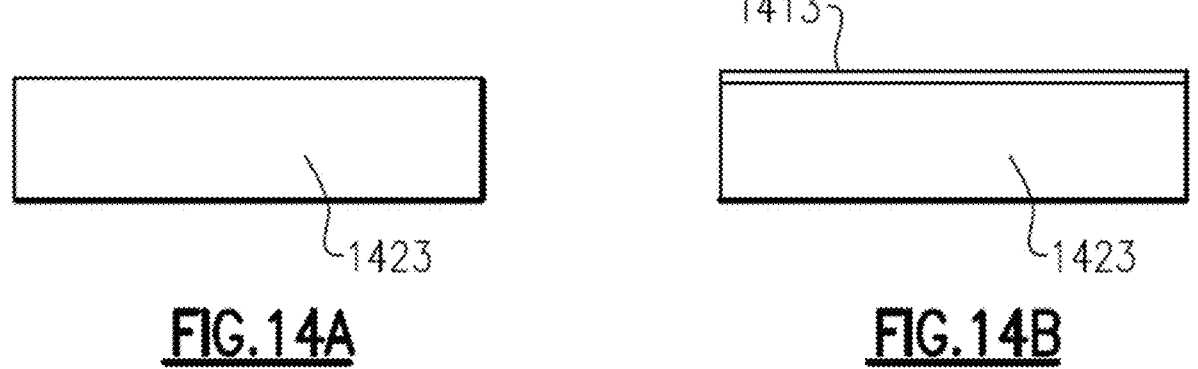
FIG. 14A-14E are cross sectional views of steps of manufacturing a device in accordance with the present disclosure.

FIG. 14A illustrates a substrate 1423 which may be composed of any suitable material, such a silicon.

FIG. 14B shows the step of oxidizing the substrate 1423 to create an oxide layer 1413. In embodiments in which the substrate is composed of silicon, 1413 will advantageously be composed of silicon dioxide. The oxidation may be thermal oxidation. Alternatively, the oxide layer 1413 may be deposited on the substrate 1423. The layer of oxide may be any thickness sufficient to protect the necessary parts from etching in the steps described hereafter.

Figure 14C:
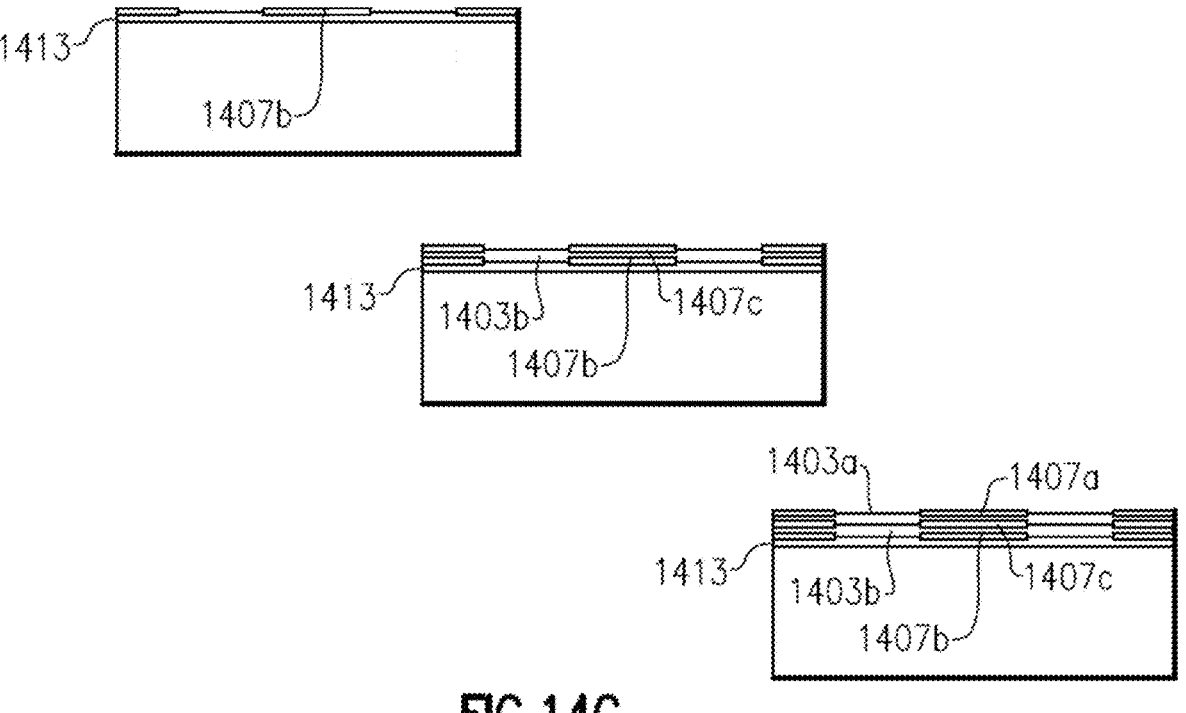

FIG. 14C shows the steps of depositing three electrodes, 1407a, 1407b and 1407c, and two piezoelectric film layers 1403a and 1403b, such that the electrodes and piezoelectric film layers form an alternating stack. Optionally the piezoelectric film layers are composed of Aluminum Nitride, or Lithium Niobate, or Lithium Tantalate, or any other suitable piezoelectric material. Any suitable conductive material can be used for the electrodes, for example molybdenum or titanium, or others.

Figure 14D:
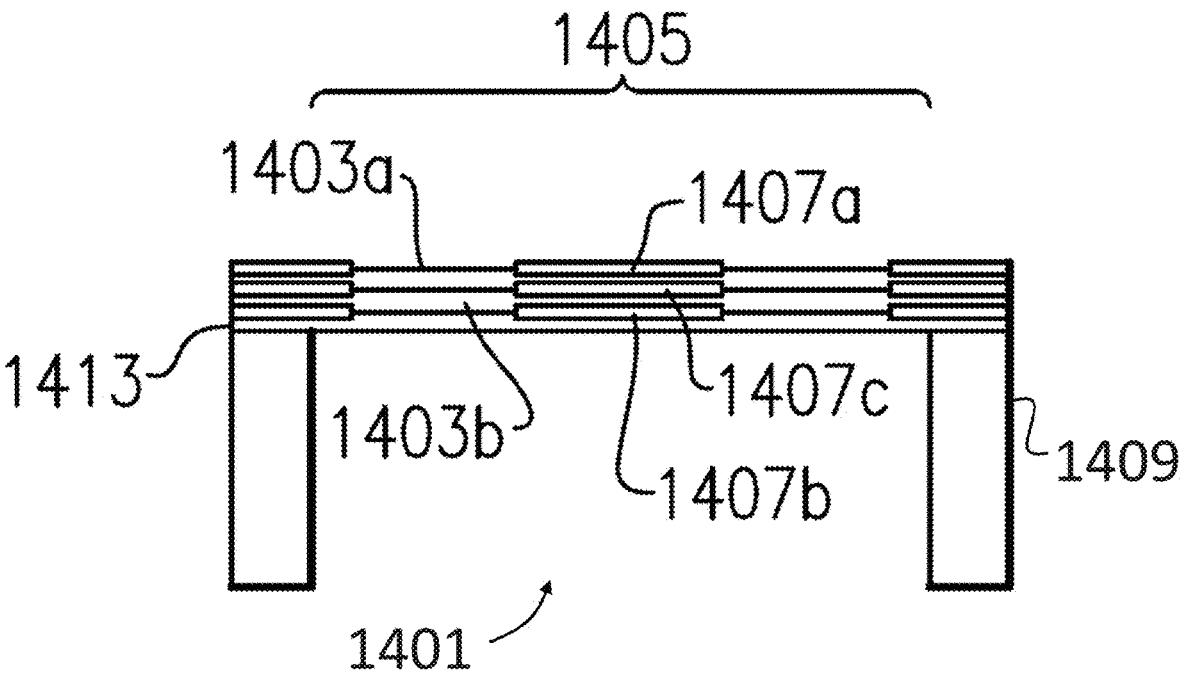

In embodiments in which the membrane comprises a hole extending through all of the layers of the membrane, through which air can pass from one side of the membrane to the other, this may be etched in an additional step between the steps described in FIGS. 14C and 14D.

FIG. 14D shows the step of etching the substrate to define a cavity 1401. The cavity is etched from the back side of the device, using an anisotropic etch. The cavity is etched by silicon etching, such that the silicon dioxide layer 1413 between the membrane and substrate is not etched. The cavity may be any shape, such as rectangular, triangular, circular, or any other shape. The cavity is defined by the substrate walls 1409.

Figure 14E:
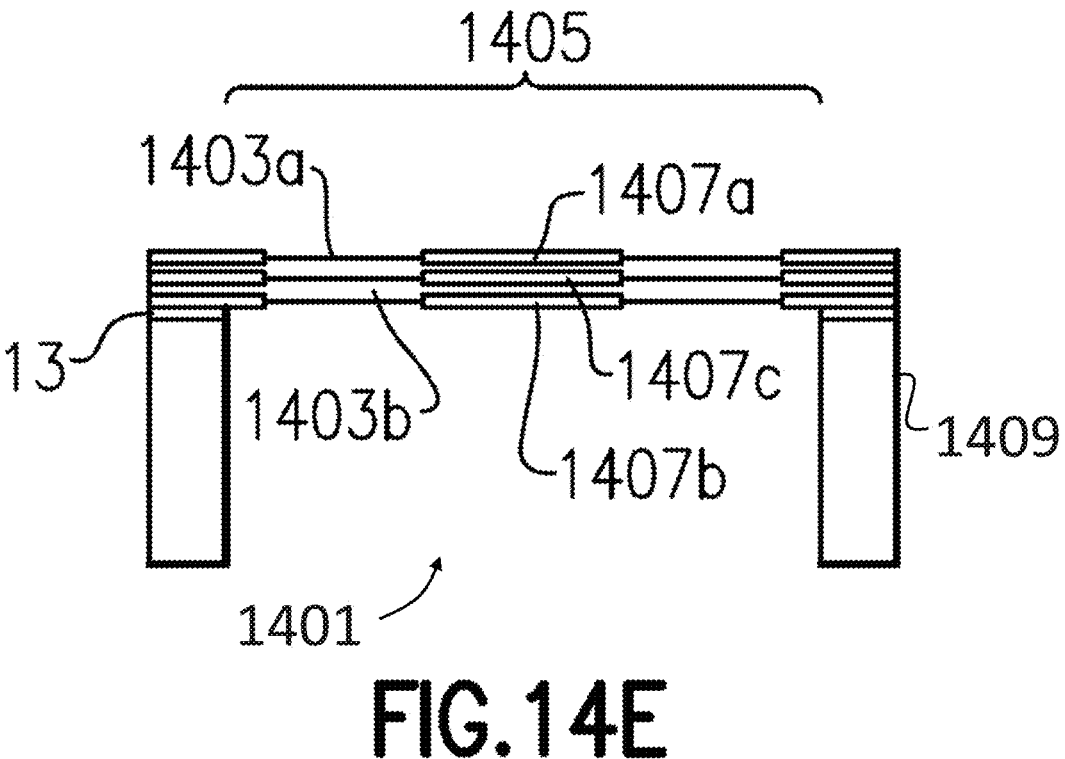

FIG. 14E shows the step of etching the silicon dioxide layer 1413. In this step an isotropic etch is used to remove the silicon dioxide layer on the cavity side of the piezoelectric film layer. It will be noted that any suitable isotropic etchant may be used. The layer of silicon dioxide located between the piezoelectric film layer 1403 and the substrate 1423 is not etched away, due to its protection by the remaining silicon, which the silicon dioxide etching does not remove. This remaining layer acts as an insulating layer as described herein.

Figure 15:
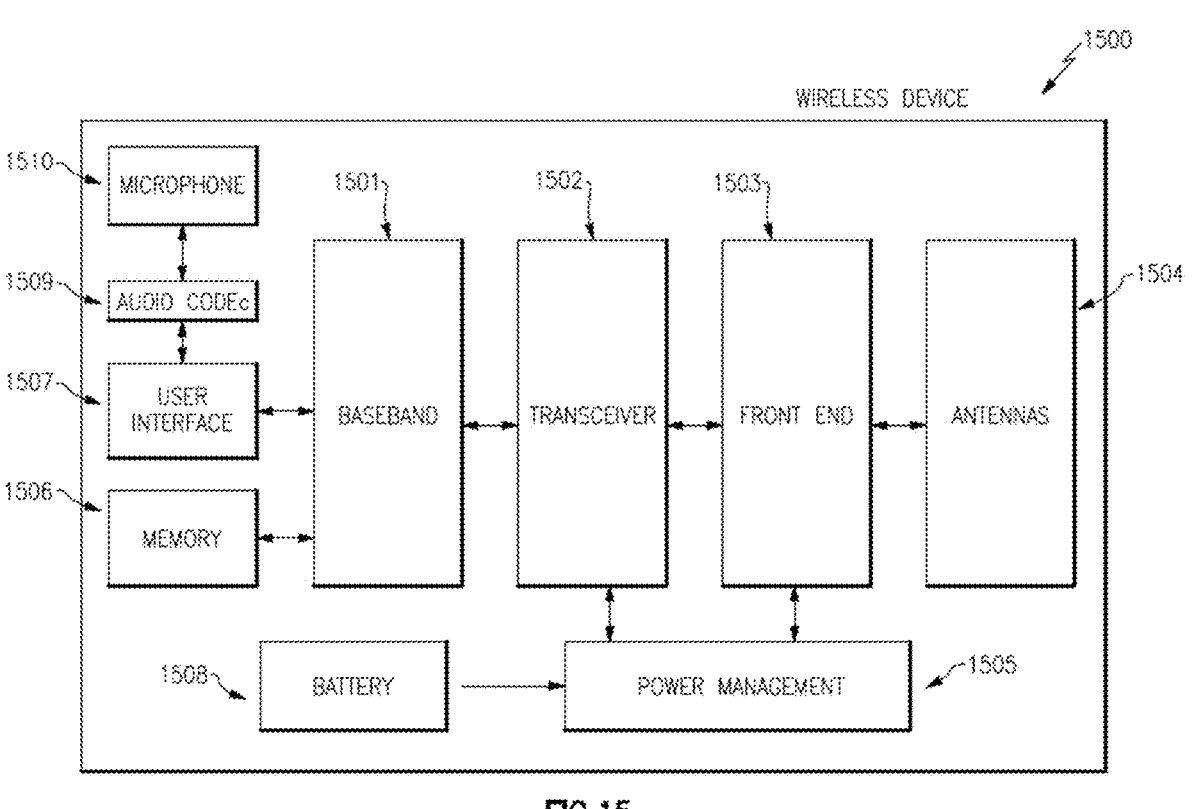
FIG. 15 is a schematic view of a wireless device in accordance with the present disclosure.

FIG. 15 is a schematic diagram of one embodiment of a wireless device 1500. The wireless device can be, for example but not limited to, a portable telecommunication device such as, a mobile cellular-type telephone. The wireless device includes a microphone arrangement 1500, including a microphone of embodiments described herein such as in relation to FIGS. 4 to 10, and may include one or more of a baseband system 1501, a transceiver 1502, a front end system 1503, one or more antennas 1504, a power management system 1505, a memory 1506, a user interface 1507, a battery 1508, and audio codec 1509. The microphone arrangement may supply signals to the audio codec 1509 which may encode analog audio as digital signals or decode digital signals to analog. The audio codec 1509 may transmit the signals to a user interface 1507. The user interface 1507 transmits signals to the baseband system 1501. The transceiver 1502 generates RF signals for transmission and processes incoming RF signals received from the antennas.

The transceiver 1503 aids in conditioning signals transmitted to and/or received from the antennas 1504.

The antennas 1504 can include antennas used for a wide variety of types of communications. For example, the antennas 1504 can include antennas 1504 for transmitting and/or receiving signals associated with a wide variety of frequencies and communications standards.

The baseband system 1501 is coupled to the user interface to facilitate processing of various user input and output, such as voice and data. The baseband system 1501 provides the transceiver 1502 with digital representations of transmit signals, which the transceiver 1502 processes to generate RF signals for transmission. The baseband system 1501 also processes digital representations of received signals provided by the transceiver 1502. As shown in FIG. 15, the baseband system 1501 is coupled to the memory to facilitate operation of the wireless device.

The memory can be used for a wide variety of purposes, such as storing data and/or instructions to facilitate the operation of the wireless device and/or to provide storage of user information.

The power management system 1505 provides a number of power management functions of the wireless device.

The power management system 1505 receives a battery voltage from the battery 1508. The battery 1508 can be any suitable battery for use in the wireless device, including, for example, a lithium-ion battery.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

For the purpose of description, it will be understood that a module can be a physical module and/or a functional block configured to provide a desired modular functionality with one or more devices and/or circuits. For example, a physical module can be a packaged module implemented on a packaging substrate, a packaged die configured to be mounted on a circuit board, or any other physical device configured to provide RF functionality. It will also be understood that a module can include one or more physical devices, including a plurality of physical devices with each sometimes being referred to as a module itself.

Also for the purpose of description, it will be understood that a component can be physical device and/or an assembly of one or more devices and/or circuits configured to provide a functionality. In some situations, a component can also be referred to as a module, and vice versa.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

The invention claimed is:

1. A piezoelectric microelectromechanical systems device comprising:
  a layer set sensitive to acoustic vibration, the layers including at least one piezoelectric layer and a two metal electrode layers, the layer set having an expected thermal stress deflection corresponding to a first thermal condition;
  a cavity having side walls supporting the layer set and providing space for acoustic vibration of the layer set into the cavity; and
  a compensation layer deposited directly onto one of the two metal electrode layers, the compensation layer having a compensation characteristic configured to compensate for the expected thermal stress deformation, such that the combined layer set and compensation layer do not have the stress deflection under the first thermal condition.

2. The device of claim 1 wherein the layer set forms an acoustic membrane spanning the cavity, and between the cavity walls and the membrane is located on a silicon dioxide layer.

3. The device of claim 1 wherein the two metal electrode layers include a layer of Molybdenum and the compensation layer includes Ruthenium deposited on the layer of Molybdenum.

4. The device of claim 1 wherein the compensation layer is selected to additionally compensate for thermal stress by conducting thermal energy from at least one of the two metal electrode layers, thereby raising the net melting point.

5. The device of claim 1 wherein at least one electrode layer includes ruthenium and the piezoelectric layer is formed thereon from aluminum nitride.

6. The device of claim 1 wherein the compensation layer is composed of the same metal as one or more of the two metal electrode layers.

7. The device of claim 1 wherein the layer set includes two piezoelectric layers and three metal electrode layers arranged in a stack that alternates between metal and piezoelectric material, and the layer set forms a membrane that spans the cavity.

8. The device of claim 7 wherein the two piezoelectric layers have different thicknesses from each other.

9. The device of claim 7 wherein at least one of the three metal electrode layers has a different thickness than at least one of the other two metal electrode layers.

10. The device of claim 1 wherein the piezoelectric layer is more than 250 nanometers thick, at least one of the metal electrode layers is less than 50 nanometers thick, and the width of the cavity is more than 400 micrometers.

11. The device of claim 7 wherein the piezoelectric microelectromechanical systems device is a microphone configured for use in a wireless mobile device, the wireless mobile device comprising one or more antennas, a front end system that communicates with the one or more antennas, and one or more piezoelectric microelectromechanical systems devices, each device including layers having properties configured to compensate for deflection due to thermal stress of other layers spanning a cavity.

\* \* \* \* \*